(12) United States Patent
Ipposhi et al.

(10) Patent No.: US 6,707,105 B2
(45) Date of Patent: Mar. 16, 2004

(54) SEMICONDUCTOR DEVICE FOR LIMITING LEAKAGE CURRENT

(75) Inventors: Takashi Ipposhi, Tokyo (JP); Toshiaki Iwamatsu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/814,116

(22) Filed: Mar. 22, 2001

(65) Prior Publication Data

US 2001/0052620 A1 Dec. 20, 2001

(30) Foreign Application Priority Data

Jun. 13, 2000 (JP) ........................................ 2000-176884
Oct. 23, 2000 (JP) ........................................ 2000-322634

(51) Int. Cl.[7] .................... H01L 27/01; H01L 27/12; H01L 31/0392
(52) U.S. Cl. ....................... 257/347; 257/653; 257/654
(58) Field of Search ................... 257/347, 106, 257/212, 371, 653, 654; 438/149, 479, 517

(56) References Cited

U.S. PATENT DOCUMENTS 6,118,152 A * 9/2000 Yamaguchi et al. ........ 257/347

OTHER PUBLICATIONS

Y. Hirano, et al. "Bulk–Layout–Compatible 0.18$\mu$m SOI–CMOS Technology Using Body–Fixed Partial Trench Isolation (PTI)" IEEE International SOI Conference, Oct. 1999, pp. 131–132.

* cited by examiner

*Primary Examiner*—Thien Tran
(74) *Attorney, Agent, or Firm*—Oblon, Spivak, McClelland, Maier & Neustadt, P.C.

(57) ABSTRACT

Formed on an insulator (9) are an N$^-$ type semiconductor layer (10) having a partial isolator formed on its surface and a P$^-$ type semiconductor layer (20) having a partial isolator formed on its surface. Source/drain (11, 12) being P$^+$ type semiconductor layers are provided on the semiconductor layer (10) to form a PMOS transistor (1). Source/drain (21, 22) being N$^+$ type semiconductor layers are provided on the semiconductor layer (20) to form an NMOS transistor (2). A pn junction (J5) formed by the semiconductor layers (10, 20) is provided in a CMOS transistor (100) made up of the transistors (1, 2). The pn junction (J5) is positioned separately from the partial isolators (41, 42), where the crystal defect is thus very small. Therefore, the leakage current is very low at the pn junction (J5).

4 Claims, 26 Drawing Sheets

F I G. 24
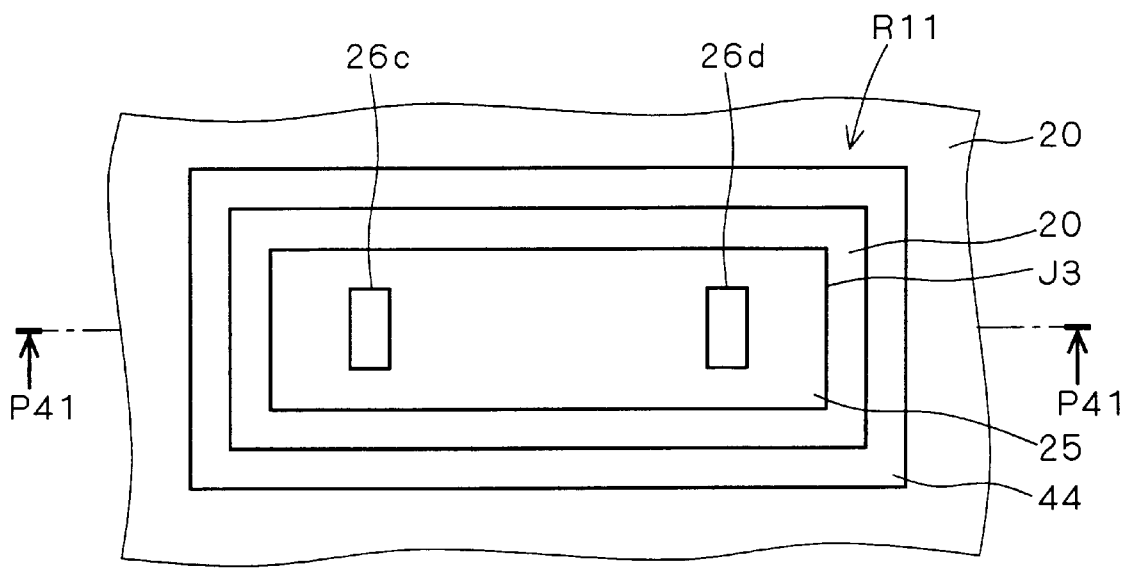
F I G. 25
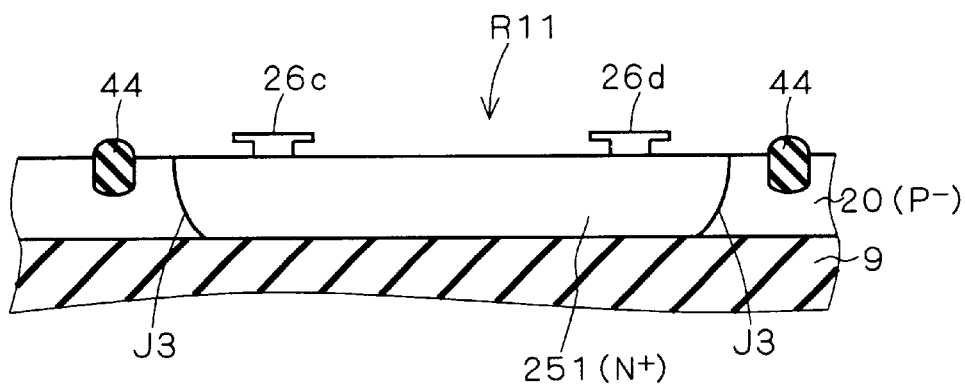

F I G. 26
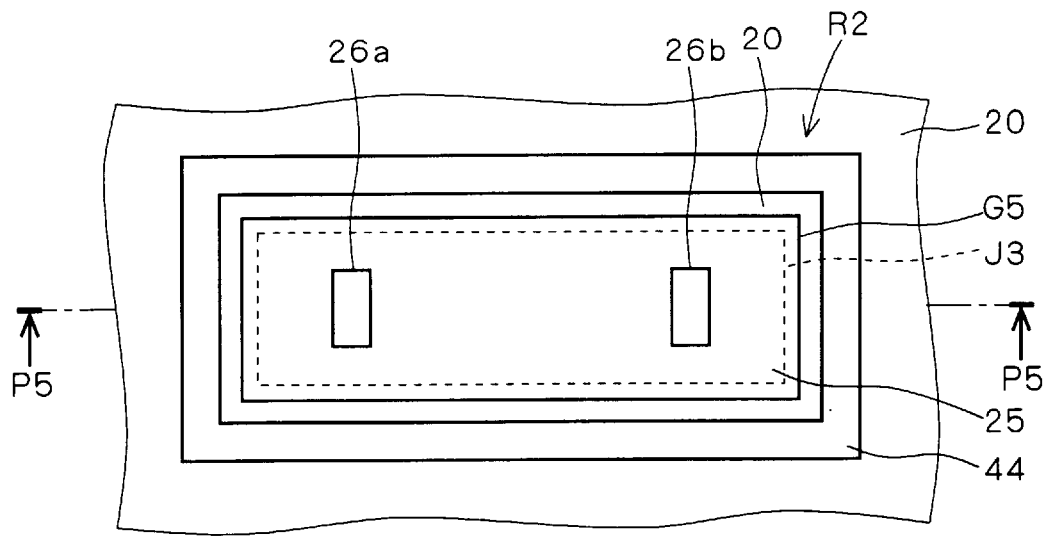
F I G. 27
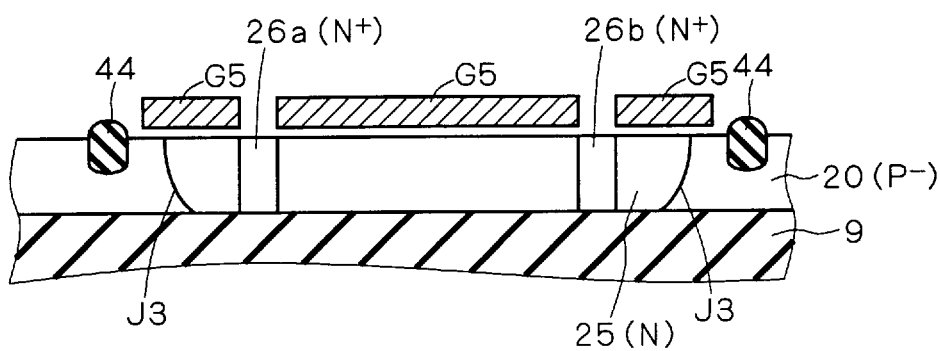
F I G. 28
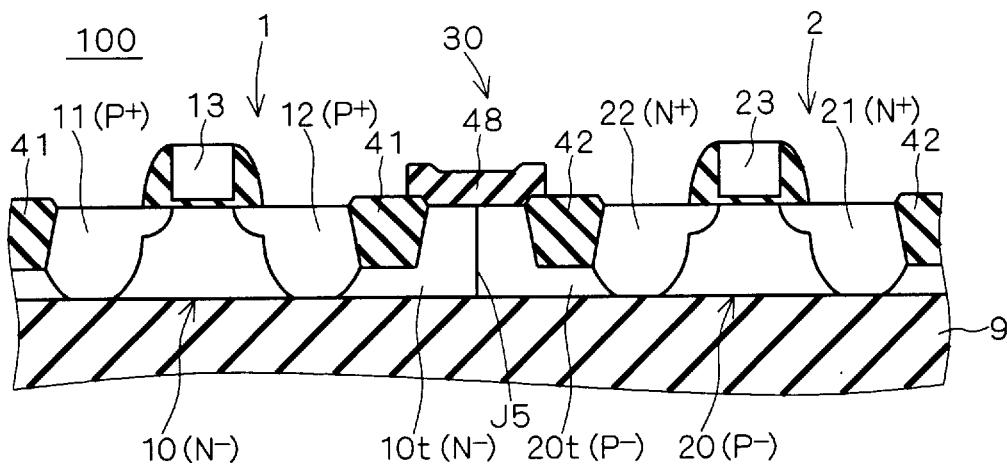

F I G. 51
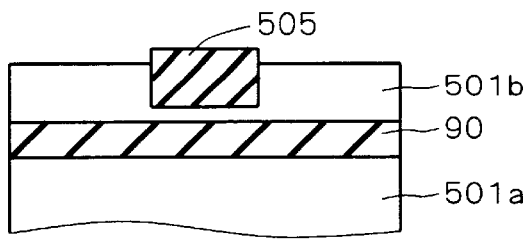
F I G. 52
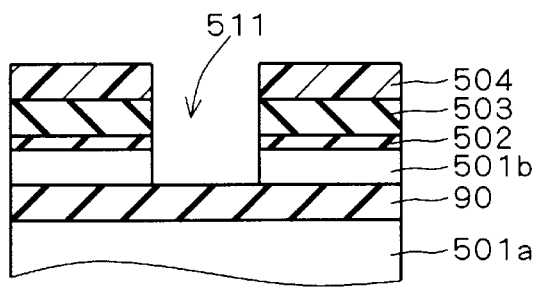
F I G. 53
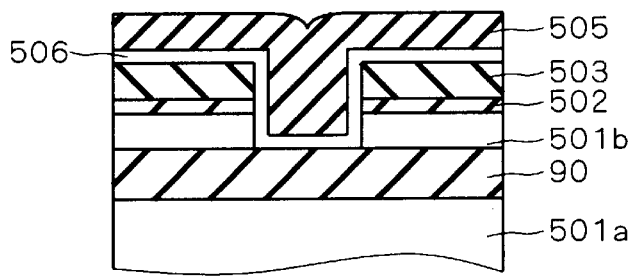
F I G. 54
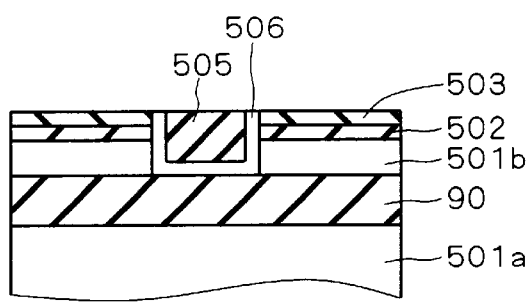

PRIOR ART

SEMICONDUCTOR DEVICE FOR LIMITING LEAKAGE CURRENT

BACKGROUND OF THE INVENTION

1. Field of the Invention

The present invention relates to a semiconductor device having a pn junction, and more particularly, a semiconductor device and a resistor having a structure where an insulative isolator is provided on a semiconductor film disposed on an insulative substrate on the opposite side to the substrate without making contact with the substrate.

2. Description of the Background Art

Proposals for a so-called SOI (Silicon On Insulator) structure have been made conventionally. FIG. 62 is a sectional view exemplifying a structure of a CMOS (Complementary Metal Oxide Semiconductor) transistor 200 having the SOI structure. A P⁻ type semiconductor layer 20 is provided on an insulator 9, and an insulative isolator 40 is provided separately from the insulator 9 on a surface of the semiconductor layer 20 on the far side from the insulator 9. Such an isolator that is separated from the insulator and provided on the surface of the semiconductor film disposed on the insulator for isolating the surface of the semiconductor layer is hereinafter tentatively referred to as "partial isolator".

N⁺ type source/drain layers 21 and 22 are provided in the semiconductor layer 20. These source/drain layers and a gate electrode 23 provided on the semiconductor layer 20 with a gate insulating film interposed therebetween constitute an NMOS transistor 2. Such an NMOS transistor having the SOI structure including the partial isolator is disclosed in "Bulk-Layout-Compatible 0.18 μm SOI-CMOS Technology Using Body-Fixed Partial Trench Isolation (PTI)" (Y. Hirano et al., 1999 IEEE International SOI Conference, October 1999, pp.131–132), for example.

An N⁻ type semiconductor layer 10 is further provided on the insulator 9. P⁺ type source/drain layers 11 and 12 provided in the semiconductor layer 10 and a gate electrode 13 provided on the semiconductor layer 10 with a gate insulating film interposed therebetween constitute a PMOS transistor 1.

The source/drain layer 22 extends through the semiconductor layer 20, and the source/drain layer 12 extends through the semiconductor layer 10 in the thickness direction, respectively, to divide the respective semiconductor layers 10 and 20 in a sectional view. There is a semiconductor layer 20t being a part of the semiconductor layer 20 and a semiconductor layer 10t being a part of the semiconductor layer 10 between the source/drain layers 12 and 22. The semiconductor layers 20t and 10t are adjacent to each other to form a pn junction J1 under the partial isolator 40, that is, between the partial isolator and the insulator 9. The pn junction J1 is positioned in the above-described manner when, for example, the pn junction J1 is formed at the stage of forming the semiconductor layers 10 and 20 before forming the partial isolator 40 and the partial isolator 40 is then formed on a boundary between the semiconductor layers 10 and 20.

In this way, semiconductor layers of conductivity types different from each other, i.e., p and n type semiconductor layers are formed as a semiconductor film having the SOI structure in a general LSI (Large Scale Integrated Circuit), and a MOS transistor and a bipolar transistor are formed using these semiconductor layers.

However, it is observed in the structure shown in FIG. 62 that the pn junction J1 positioned under the partial isolator 40 results in occurrence of an abnormal leakage current at the pn junction J1.

SUMMARY OF THE INVENTION

According to a first aspect of the present invention, a semiconductor device comprises: a substrate at least having an insulative surface; a semiconductor film provided on the surface of the substrate comprising a first semiconductor layer of a first conductivity type, a second semiconductor layer of the first conductivity type having an impurity concentration lower than that of the first semiconductor layer, a third semiconductor layer of a second conductivity type opposite to the first conductivity type and a fourth semiconductor layer of the second conductivity type having an impurity concentration lower than that of the third semiconductor layer; and an insulative isolator formed on a surface of the semiconductor film on the far side from the substrate, separately from the surface of the substrate. In the semiconductor device, the second and fourth semiconductor layers form a pn junction extending in the thickness direction of the semiconductor film, and a maximum value of a distance between the pn junction and a boundary between the isolator and the semiconductor film is not more than 2 μm, when a direction from the boundary to the isolator along the surface of the substrate is taken as a positive direction.

According to a second aspect of the present invention, in the semiconductor device of the first aspect, the pn junction has a portion separated from the isolator.

According to a third aspect of present invention, in the semiconductor device of the second aspect, the portion of the pn junction separated from the isolator forms a semiconductor element.

According to a fourth aspect of the present invention, in the semiconductor device of the third aspect, the first, second, fourth and third semiconductor layers are adjacent to each other in this order, and the first and third semiconductor layers function as a contact with respect to the pn junction.

According to a fifth aspect of the present invention, in the semiconductor device of the second aspect, the first, fourth, second and third semiconductor layers are adjacent to each other in this order, and the first and second semiconductor layers function as source/drain layers of MOS transistors having conductivity types different from each other, respectively.

According to a sixth aspect of the present invention, the semiconductor device of the second aspect further comprises a cover having an insulative surface in contact with the portion of the pn junction separated from the isolator.

According to a seventh aspect of the present invention, the semiconductor device of the fifth aspect further comprises a cover having an insulative surface in contact with the portion of the pn junction separated from the isolator.

According to an eighth aspect of the present invention, in the semiconductor device of the second aspect, the second semiconductor layer is provided in the fourth semiconductor layer, the first semiconductor layer includes a pair of first semiconductor layers being formed in the second semiconductor layer, and the pair of first semiconductor layers function as a contact with respect to the second semiconductor layer.

According to a ninth aspect of the present invention, a semiconductor device comprises: a substrate at least having an insulative surface; a semiconductor film provided on the surface of the substrate, having at least one pn junction extending in a thickness direction of the substrate, the at least one pn junction including a pn junction which is applied with voltage; and a metallic compound layer selectively formed on the semiconductor film, being a compound of the semiconductor film and metal. In the semiconductor device, a maximum value of a distance between at least the pn junction which is applied with voltage and a boundary between the metallic compound layer and the semiconductor film is not more than 2 µm, when a direction from the boundary to the semiconductor film along the surface of the substrate is taken as a positive direction.

According to a tenth aspect of the present invention, the semiconductor device of the ninth aspect further comprises a mask provided on the at least one pn junction for preventing combination of the at least one pn junction with metal of the semiconductor film.

According to an eleventh aspect of the present invention, in the semiconductor device of the tenth aspect, the mask has the same structure as a gate of a MOS transistor to be formed on the semiconductor film in a thickness direction thereof.

According to a twelfth aspect of the present invention, a resistor comprises: a substrate at least having an insulative surface; a first semiconductor layer of a first conductivity type provided on the surface of the substrate; an insulative isolator formed on a surface of the first semiconductor film on the far side from the substrate, separately from the surface of the substrate; and a second semiconductor layer of a second conductivity type opposite to the first conductivity type formed in the first semiconductor layer, the second semiconductor layer forming a pn junction in conjunction with the first semiconductor layer, the pn junction extending from the surface of the first semiconductor layer to the surface of the substrate and being separated from the isolator.

According to a thirteenth aspect of the present invention, the resistor of the twelfth aspect further comprises a pair of third semiconductor layers of the second conductivity type formed in the second semiconductor layer, having an impurity concentration higher than that of the second semiconductor layer.

According to a fourteenth aspect of the present invention, the resistor of the thirteenth aspect further comprises a gate electrode covering the pn junction.

According to a fifteenth aspect of the present invention, the resistor of the thirteenth aspect further comprises a cover having an insulative surface in contact with the portion of the pn junction separated from the isolator.

According to a sixteenth aspect of the present invention, a method of manufacturing a semiconductor device comprises the steps of: (a) providing on an insulator a pn junction formed by a first semiconductor layer of a first conductivity type and a second semiconductor layer of a second conductivity type opposite to the first conductivity type, the pn junction extending from surfaces of the first and second semiconductor layers to the insulator, and providing an insulative isolator on the surfaces of the first and second semiconductor layers on the far side from the insulator, separately from the pn junction and the insulator; (b) forming a pair of third semiconductor layers in the first semiconductor layer as first source/drain layers, the third semiconductor layers having the second conductivity type and an impurity concentration higher than that of the second semiconductor layer; (c) forming a pair of fourth semiconductor layers in the second semiconductor layer as second source/drain layers, the fourth semiconductor layers having the first conductivity type and an impurity concentration higher than that of the first semiconductor layer; and (d) forming an insulating film on the pn junction and a pair of the first and second source/drain layers.

According to a seventeenth aspect of the present invention, in the method of the sixteenth aspect, the insulating film is formed in the step of forming gate insulating films of MOS transistors of conductivity types different from each other, the MOS transistors each having the first and second source/drain layers.

According to an eighteenth aspect of the present invention, in the method of the sixteenth aspect, the insulating film is formed in the step of forming sidewalls of gate electrodes of MOS transistors of conductivity types different from each other, the MOS transistors each having the first and second source/drain layers.

According to a nineteenth aspect of the present invention, a method of manufacturing a semiconductor device comprises the steps of: (a) providing on an insulator a pn junction formed by a first semiconductor layer and a second semiconductor layer of a conductivity type different from that of the first semiconductor layer, the pn junction extending from a surface of the first and second semiconductor layers to the insulator, and providing an insulative isolator on the surface of the first and second semiconductor layers on the far side from the insulator, separately from the insulator, the insulative isolator having an opening for exposing the pn junction; (b) forming a semiconductor element having a gate on the first semiconductor layer; (c) forming a mask which covers the pn junction at the opening and exposes at least part of the surface of the first and second semiconductor layers at the opening; and (d) combining the surface of the first and second semiconductor layers which is exposed with metal.

According to a twentieth aspect of the present invention, in the method of the nineteenth aspect, the steps (b) and (c) are performed by the same process.

In the semiconductor device according to the first or second aspect, the defect density is very low at a position not more than 2 µm from the boundary between the isolator and the semiconductor film, or a position where the isolator is not formed. This allows great reduction of the leakage current at the pn junction formed at the position.

The semiconductor device according to the third aspect can improve the flexibility in layout of the semiconductor device.

In the semiconductor device according to the fourth aspect, a diode with reduced leakage current can be obtained.

In the semiconductor device according to the fifth aspect, a CMOS transistor with reduced leakage current can be obtained.

In the semiconductor device according to the sixth or seventh aspect, it is possible to prevent the second and fourth semiconductor layers from being silicided when siliciding the first and third semiconductor layers.

In the semiconductor device according to the eighth aspect, a resistor with reduced leakage current can be obtained.

In the semiconductor device according to the ninth aspect, the defect density is very low at a position not more than 2 µm from the boundary between the metallic compound and the semiconductor film. This allows great reduction of the leakage current at the pn junction formed at the position.

In the semiconductor device according to the tenth aspect, the pn junction is prevented from being shorted.

In the semiconductor device according to the eleventh aspect, it is possible to improve flatness of the interlayer insulating film to be formed on the semiconductor layer.

In the resistor according to the twelfth to fourteenth aspects, the pn junction is formed separately from the isolator, and the third semiconductor layer functions as a contact with respect to the resistor formed by the second semiconductor layer. Therefore, a resistor with reduced leakage current can be obtained.

In the resistor according to the fifteenth aspect, the first and second semiconductor layers can be prevented from being shorted even with silicidation performed.

With the method according to the sixteenth aspect, the semiconductor device of the sixth aspect can be manufactured.

With the method according to the seventeenth or eighteenth aspect, the semiconductor device of the sixth aspect can be manufactured easily.

With the method according to the nineteenth aspect, the semiconductor device of the eleventh aspect can be manufactured.

With the method according to the twentieth aspect, the semiconductor device of the eleventh aspect can be manufactured.

Consequently, the present invention is directed to a semiconductor device for controlling where the pn junction is positioned and suppressing occurrence of the leakage current.

These and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a plan view showing another structure of the semiconductor device according to the fourth preferred embodiment;

FIG. 25 is a sectional view showing another structure of the semiconductor device according to the fourth preferred embodiment;

FIG. 26 is a plan view showing still another structure of the semiconductor device according to the fourth preferred embodiment;

FIG. 27 is a sectional view showing still another structure of the semiconductor device according to the fourth preferred embodiment;

FIGS. 28 and 29 are sectional views showing a method of forming a semiconductor device according to a fifth preferred embodiment of the present invention in sequential order of steps;

FIGS. 46 through 51 are sectional views showing a first method of forming a partial isolator in sequential order of steps;

FIGS. 52 through 56 are sectional views showing a second method of forming a partial isolator in sequential order of steps;

DESCRIPTION OF THE PREFERRED EMBODIMENTS

Basic Idea of the Invention

A basic idea of the present invention will be described below before explaining preferred embodiments of the present invention. Of course, the basic idea falls within the scope of the present invention.

In the present invention, a pn junction is formed at a position where the defect density is low so as to reduce the leakage current. To reduce the defect density at the position where the pn junction is to be formed in the present invention, an influence of stress should be considered. For instance, formation of a partial isolator on a surface of a semiconductor will lead to an increase in stress on the surface of the semiconductor at a position away from the partial isolator, resulting in an increase in the defect density. Stress may be increased also in a semiconductor having its surface combined with metal such as silicided silicon. Thus, fixation of a defect or gettering of an impurity occurs.

Accordingly, the present invention is directed to provide a semiconductor device in which the defect density is low at a pn junction by forming the pn junction away from a position where stress is generated or in the vicinity of a position where stress is generated.

Figure 1:
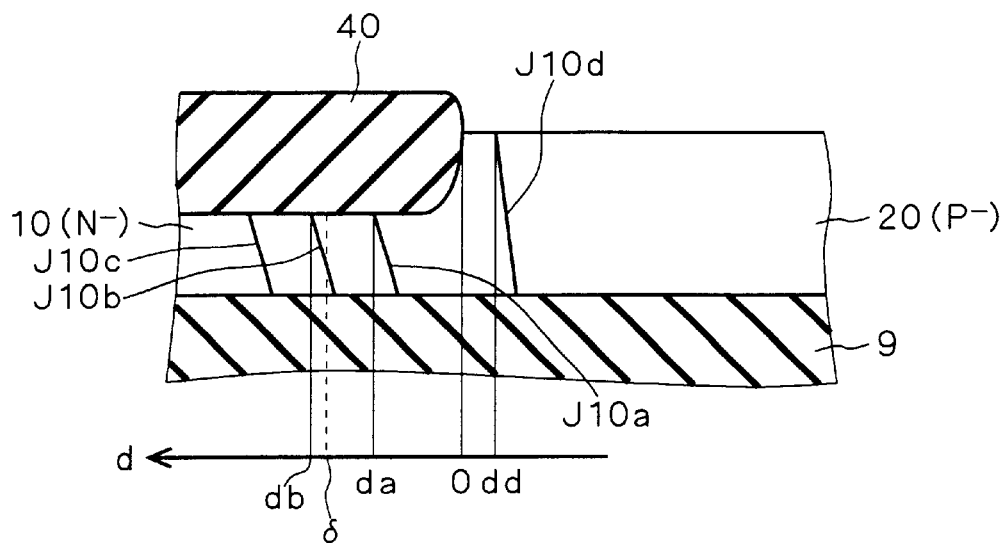
FIG. 1 is a sectional view showing a basic idea of the present invention.

FIG. 1 is a sectional view showing a structure in the vicinity of the partial isolator 40. The N⁻ type semiconductor layer 10 and the P⁻ type semiconductor layer 20 form any one of pn junctions J10$a$, J10$b$, J10$c$ and J10$d$. The pn junctions J10$a$ to J10$d$ have one end on a surface of the insulator 9, respectively, and extend in the thickness direction of a semiconductor film formed by the semiconductor layers 10 and 20. The insulative partial isolator 40 is formed at least on a surface of the semiconductor layer 10 on the far side from the insulator 9, separately from the insulator 9.

On a boundary between the semiconductor film formed by the semiconductor layers 10, 20 and the partial isolator 40, the position nearest to the semiconductor layer 20 or the position most distant from the semiconductor layer 10 is defined as an end of the partial isolator 40. A direction from the end toward the partial isolator 40 in parallel to the surface of the insulator 9 is taken as a positive direction and a distance from the end is indicated by d. Generally speaking, the distance d may be understood as extending from a so-called active region obtained by dividing the semiconductor layers 10 and 20 by the partial isolator 40 toward the partial isolator 40.

Figure 2:
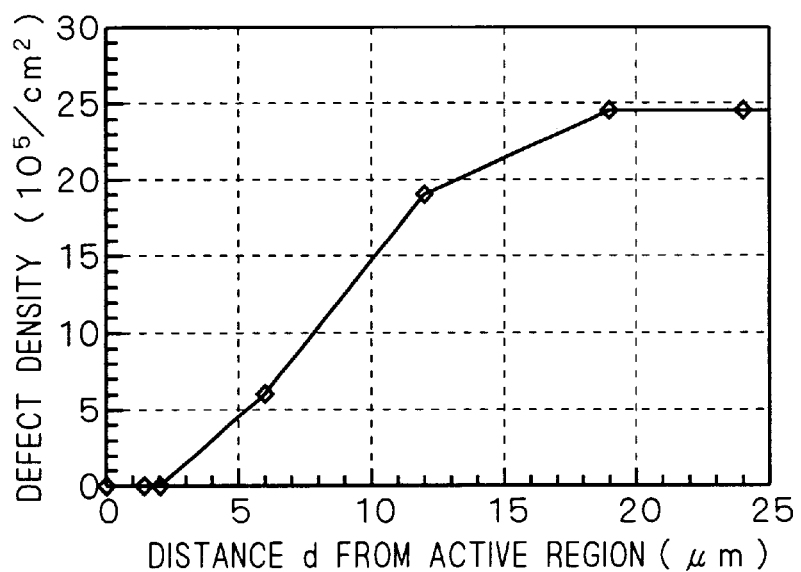
FIG. 2 is an explanatory graph of the basic idea of the present invention.

FIG. 2 is a graph showing the dependence of the defect density of the semiconductor layers 10 and 20 on the distance d. As understood from the graph, the defect density suddenly increases when the value d exceeds 2 $\mu$m. It is considered that formation of the partial isolator 40 causes stress on the semiconductor layers 10 and 20, resulting in such an increase in the defect density.

Referring to FIG. 1, the value $\delta$ represents 2 $\mu$m. The leakage current is very low in the case that the semiconductor layers 10 and 20 form the pn junction J10$a$ where a maximum value da of the distance d is not more than the value $\delta$. However, reduction of the leakage current cannot be expected in the case that the semiconductor layers 10 and 20 form the pn junction J10$b$ where a maximum value db of the distance d exceeds the value $\delta$. It can be said that there is an effect of reducing the leakage current compared to the case that the semiconductor layers 10 and 20 form the pn junction J10$c$ where even a minimum value of the distance d exceeds the value $\delta$.

The pn junction J10$d$ is at a position where a maximum value of the distance d is negative. This is the case that the pn junction J10$d$ is not positioned under the partial isolator 40 but in the active region as a whole. It is needless to say that the leakage current is very low also at the pn junction J10$d$.

As described above, the two semiconductor layers and the partial isolator are designed to have such positional relationship that satisfies a condition in which a pn junction is positioned in a range of distance not more than 2 $\mu$m from the end of the partial isolator in the above described direction, in other words, a condition in which a maximum value of a distance between the pn junction and the boundary between the partial isolator and the semiconductor film made by the two semiconductor layers having conductivity types different from each other is not more than 2 $\mu$m, seeing a direction from the boundary toward the partial isolator as a positive direction. This enables to greatly reduce the leakage current at the pn junction.

Figure 3:
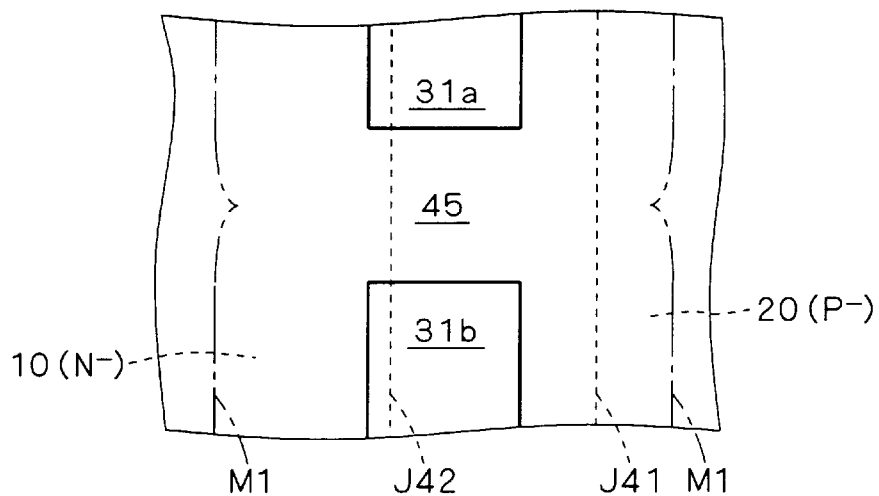
FIGS. 3 through 5 are plan views showing the basic idea of the present invention.

FIG. 3 is a plan view showing a structure where active regions 31$a$ and 31$b$ is exposed by a partial isolator 45. The semiconductor layers 10 and 20 are positioned at the back of the drawing. A boundary M1 shown by chain lines in the drawing indicates a position 2 $\mu$m from the active regions 31$a$ and 31$b$.

The semiconductor layers 10 and 20 are in contact with an insulator not shown (corresponding to the insulator 9 in FIG. 1) and form a pn junction J41 or J42. Since both of the pn junctions J41 and J42 are positioned on the side of the active regions 31$a$ and 31$b$ with respect to the boundary M1, the leakage current at J41 and J42 can be reduced. The pn junction J41 is covered by the partial isolator 45 without being exposed in the active regions 31$a$ and 31$b$, while the pn junction J42 is exposed in the active regions 31$a$ and 31$b$. As described above, a portion of the pn junction J42 exposed in the active regions 31$a$ and 31$b$ represents the case that the distance d is a negative value in view of FIGS. 1 and 2.

Figure 4:
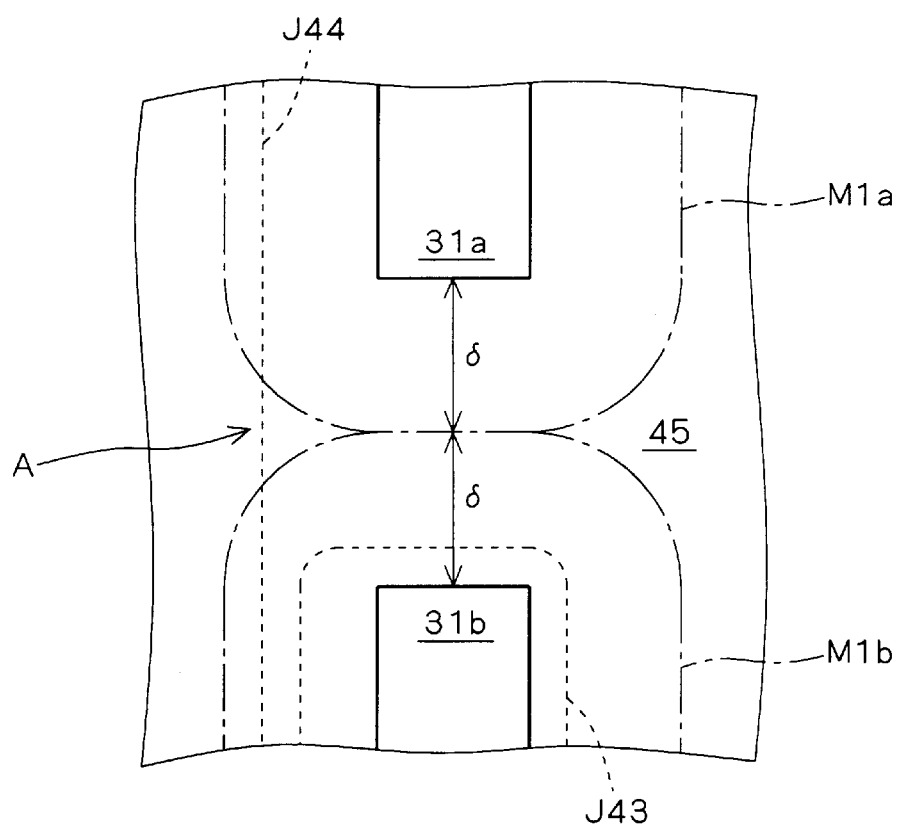

FIG. 4 is a plan view showing the case that the active regions 31$a$ and 31$b$ are separated from each other by 2$\delta$=4 $\mu$m. Boundaries M1$a$ and M1$b$ are defined at a position $\delta$=2 $\mu$m from the active regions 31$a$ and 31$b$, respectively. The semiconductor layers 10 and 20 form either of pn junctions J43 and 44 which extend from the partial isolator 45 to the insulator 9. Since the pn junction J43 is positioned on the side of the active region 31$b$ with respect to the boundary M1$b$, the leakage current at the pn junction J43 can be reduced. In the case that the semiconductor layers 10 and 20 form the pn junction J44, however, the pn junction J44 is distant from the active regions 31$a$ and 31$b$ at a position A with respect to the boundaries M1$a$ and M1$b$. Therefore, the leakage current at the position A cannot be reduced. Consequently, such a pn junction that straddles the boundaries M1$a$ and M1$b$ as described above is not preferable for reducing the leakage current.

Figure 5:
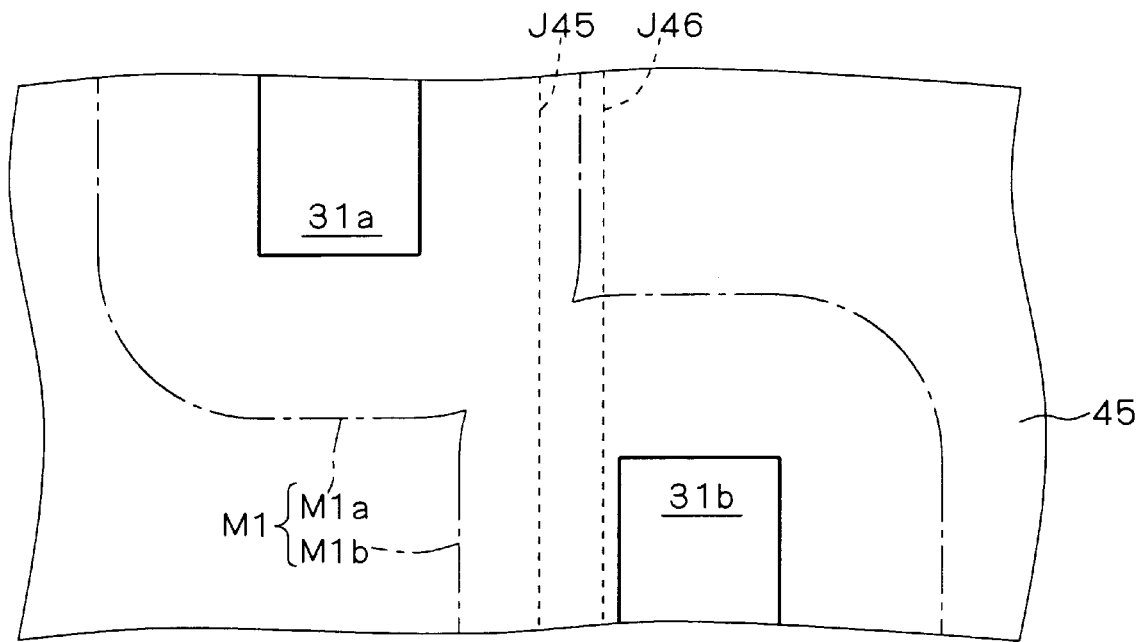

FIG. 5 is a plan view exemplifying the case that sides of the active regions 31a and 31b are not opposed to each other. The boundaries M1a and M1b, positioned 2 μm from the active regions 31a and 31b, respectively, overlap between two corners of the active regions 31a and 31b most proximate to each other, and form one boundary M1 as a whole. The semiconductor layers 10 and 20 form either of pn junctions J45 and J46 which extend from the partial isolator 45 to the insulator 9. Even when the active regions 31a and 31b are not lined in a direction that the pn junction J45 extends, the pn junction J45 is positioned on either side of the active region 31a or 31b with respect to the boundary M1. Therefore, the leakage current at the pn junction J45 can be reduced.

In the case that the semiconductor layers 10 and 20 form the pn junction J46, however, the active regions 31a and 31b are not lined in a direction that the pn junction J46 extends. The pn junction J46 is nearer to the active region 31b than the boundary M1b at a portion, whereas it is more distant from the active region 31a than the boundary M1a at another portion. Therefore, it is more preferable to form the pn junction J45 rather than J46 for reducing the leakage current.

Figure 6:
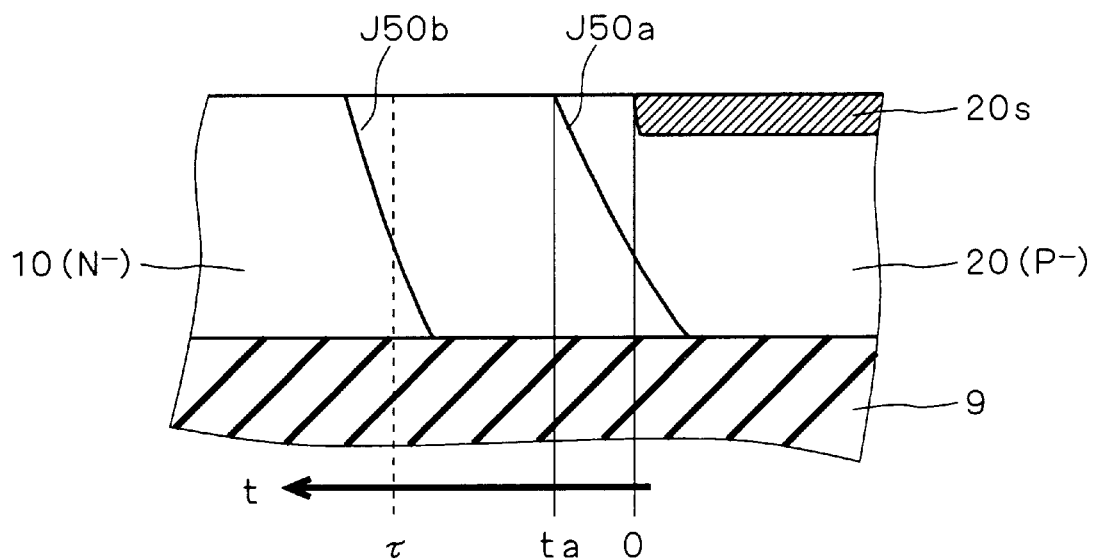
FIG. 6 is a sectional view showing the basic idea of the present invention.

FIG. 6 is a sectional view showing a structure in which a semiconductor having its surface combined with metal forms a pn junction. The N⁻ type semiconductor layer 10 and the P⁻ type semiconductor layer 20, e.g. mainly made of silicon, form either one of pn junctions J50a and J50b. A silicide film 20s is formed at least on a part of a surface of the P⁻ type semiconductor layer 20, separately from the insulator 9. The pn junctions 50a and 50b have one end on the surface of the insulator 9, respectively, and extend in the thickness direction of a semiconductor film formed by the semiconductor layers 10 and 20.

On a boundary between the silicide film 20s and the semiconductor film formed by the semiconductor layers 10 and 20, the position nearest to the semiconductor layer 20 or the position most distant from the semiconductor layer 10 is defined as an end of the silicide film 20s. A direction from the end toward the semiconductor layer 10 in parallel to the surface of the insulator 9 is taken as a positive direction and a distance from the end is indicated by t. Generally speaking, the distance t may be understood as extending from the silicide film 20s toward the semiconductor layer 10.

Figure 7:
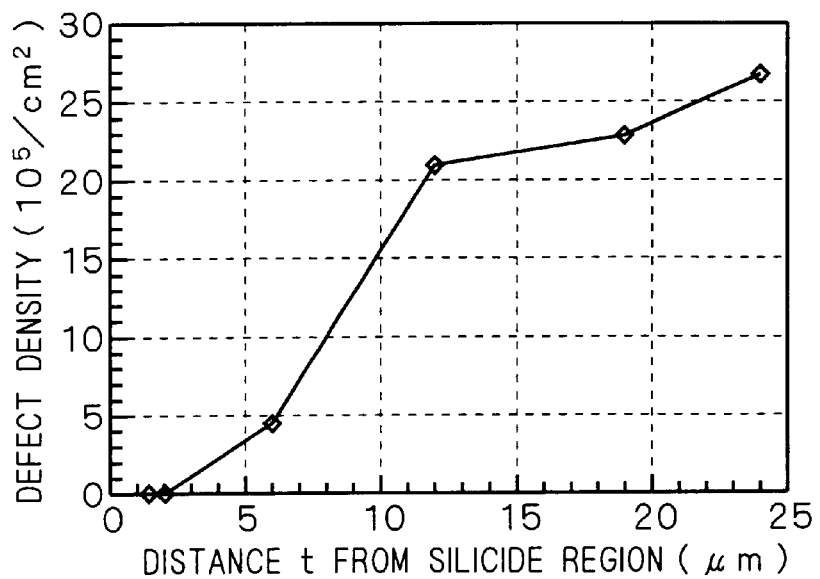
FIG. 7 is an explanatory graph of the basic idea of the present invention.

FIG. 7 is a graph showing the dependence of the defect density of the semiconductor layers 10 and 20 on the distance t. As understood from the graph, the defect density suddenly increases when the value t exceeds 2 μm. The reason is considered as follows: as described above, stress generated inside the silicide film 20s with formation of the film gives rise to the fixation of a defect and gettering of an impurity, which suppresses occurrence of crystal defect within a range around the silicide film 20s.

Referring to FIG. 6, the value τ represents 2 μm. In the case that the semiconductor layers 10 and 20 form the pn junction J50a, the leakage current is very low at J50a. This is because, even at the distance t=ta where the pn junction 50a is most distant from the silicide film 20s, the relation ta≤τ is satisfied. However, reduction of the leakage current cannot be expected in the case that the semiconductor layers 10 and 20 form the pn junction J50b where a maximum value tb of the distance t exceeds the value τ.

The pn junction 50a has such a form that the distance t has a negative value in the vicinity of the insulator 9. The effect of the present invention can be obtained even with a pn junction having a position where t<0 on the condition that the pn junction is not in contact with the silicide film 20s to avoid short circuit as the pn junction 50a.

As described above, the two semiconductor layers and the silicide film are designed to have such positional relationship that satisfies a condition in which a pn junction is positioned in a range of distance not more than 2 μm from the end of the silicide film in the above described direction, in other words, a condition in which a maximum value of a distance, along a surface of a semiconductor film made by the two semiconductor layers forming a pn junction, between the pn junction and the boundary between the semiconductor film and the silicide film formed on the surface of the semiconductor film is not more than 2 μm, seeing a direction from the boundary toward the surface of the semiconductor film on which the silicide film is not formed as a positive direction. This enables to greatly reduce the leakage current at the pn junction. To reduce the leakage current, it is desirable that the above condition should be satisfied at all of pn junctions to which voltage is applied, at least including a pn junction formed by a P well and an N well.

Figure 8:
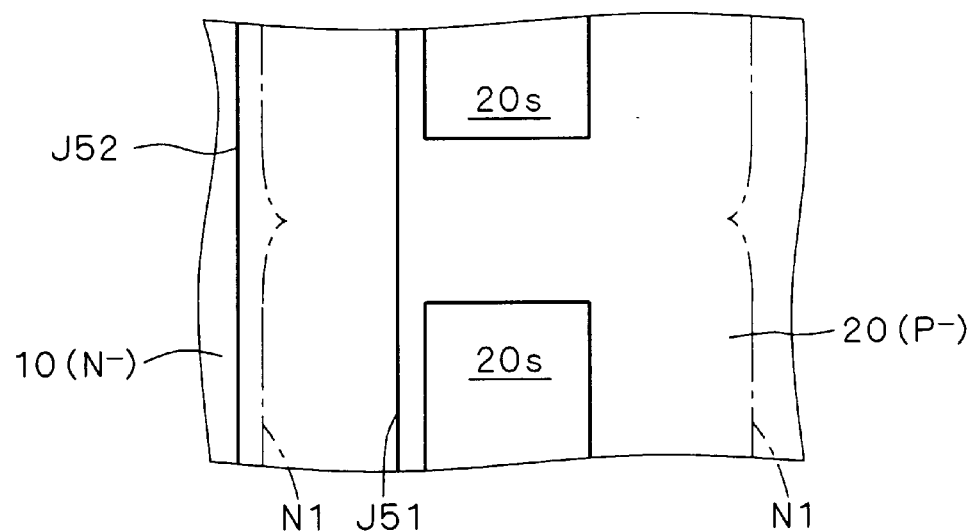
FIGS. 8 through 11 are plan views showing the basic idea of the present invention.

FIG. 8 is a plan view showing the positional relationship between the silicide film and a pn junction. The semiconductor layers 10 and 20 form a pn junction J51 or J52. The silicide film 20s is selectively provided on the surface of the semiconductor layer 20. A boundary N1 shown by chain lines in the drawing indicates a position 2 μm from the silicide film 20s.

Since the semiconductor layers 10 and 20 are in contact with an insulator not shown (corresponding to the insulator 9 in FIG. 6) and the pn junction J51 is positioned on the side of the silicide film 20s with respect to the boundary N1, the leakage current at J51 is reduced. Since the pn junction J52 is positioned on the side of the semiconductor layer 10 with respect to the boundary N1, reduction of the leakage current at J52 cannot be expected.

Figure 9:
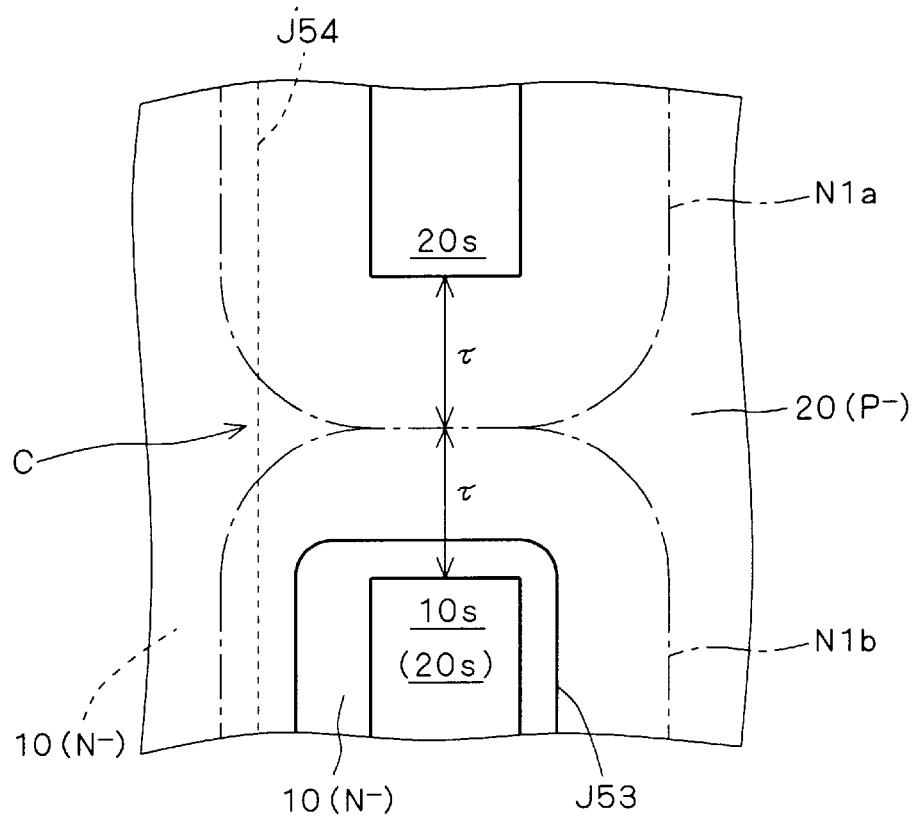

FIG. 9 is a plan view showing the case that two silicide films are separated from each other by 2τ=4 μm. Boundaries N1a and N1b are defined at a position τ=2 μm from the silicide films shown separately on top and bottom of the drawing, respectively. The semiconductor layers 10 and 20 form a pn junction J53 shown by solid line or a pn junction J54 shown by dashed lines.

In the case that the pn junction J53 is formed, the silicide films shown separately on top and bottom of the drawing are silicide films 20s and 10s formed on the surface of the semiconductor layers 20 and 10, respectively. Since the pn junction J53 is positioned on the side of the silicide film 10s with respect to the boundary N1b, the leakage current at J53 is reduced. On the other hand, in the case that the pn junction J54 is formed, the silicide films shown separately on top and bottom of the drawing are both the silicide film 20s formed on the semiconductor layer 20 (reference character 20s in parenthesis in the silicide film shown on bottom of the drawing applies to the case that the pn junction J54 shown by dashed lines is formed). Since the pn junction J54 is distant from the silicide films 20s at a position C with respect to the boundaries N1a and N1b, the leakage current at the position C cannot be reduced. Consequently, such a pn junction that straddles the boundaries N1a or N1b is not preferable for reducing the leakage current.

Figure 10:
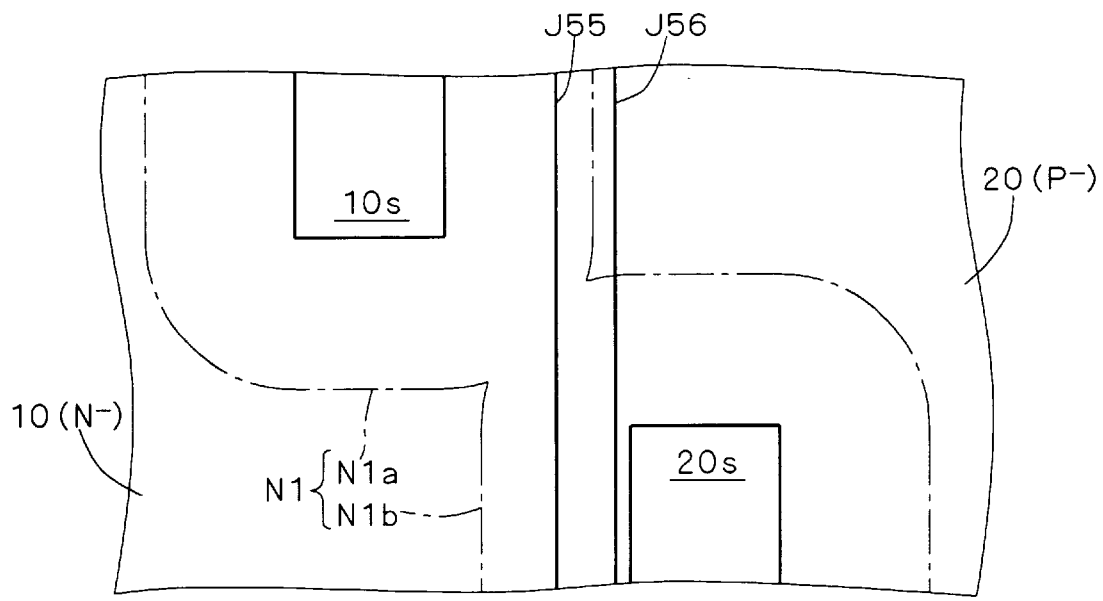

FIG. 10 is a plan view exemplifying the case that sides of the silicide films are not opposed to each other. The boundaries N1a and N1b, positioned 2 μm from the silicide films 10s and 20s formed on the semiconductor layers 10 and 20, respectively, overlap between two corners of the silicide films 10s and 20s most proximate to each other, and form one boundary N1 as a whole. The drawing exemplifies the case that either one of pn junctions J55 and J56 is formed to extend from the surface of the semiconductor film formed by the semiconductor layers 10 and 20 to the insulator 9. Even if the silicide films 10s and 20s are not lined in a direction that the pn junction J55 extends, the pn junction J55 is positioned on either side of the silicide film 10s or 20s with respect to the boundary N1. Therefore, the leakage current at the pn junction J55 is reduced.

In the case that the semiconductor layers 10 and 20 form the pn junction J56, however, the silicide films 10s and 20s are not lined in a direction that the pn junction J56 extends. The pn junction J56 is nearer to the silicide film 20s than the boundary N1b at a portion, whereas it is more distant from the silicide film 10s than the boundary N1a at another portion. Therefore, it is more preferable to form the pn junction J55 rather than J56 for reducing the leakage current.

A semiconductor element may or may not be formed on the active regions 31a and 31b. In addition, a semiconductor device having the silicide films 10s and 20s as electrodes may or may not be formed. Such loose restriction is desirable for improving the flexibility in layout of a semiconductor device.

Figure 11:
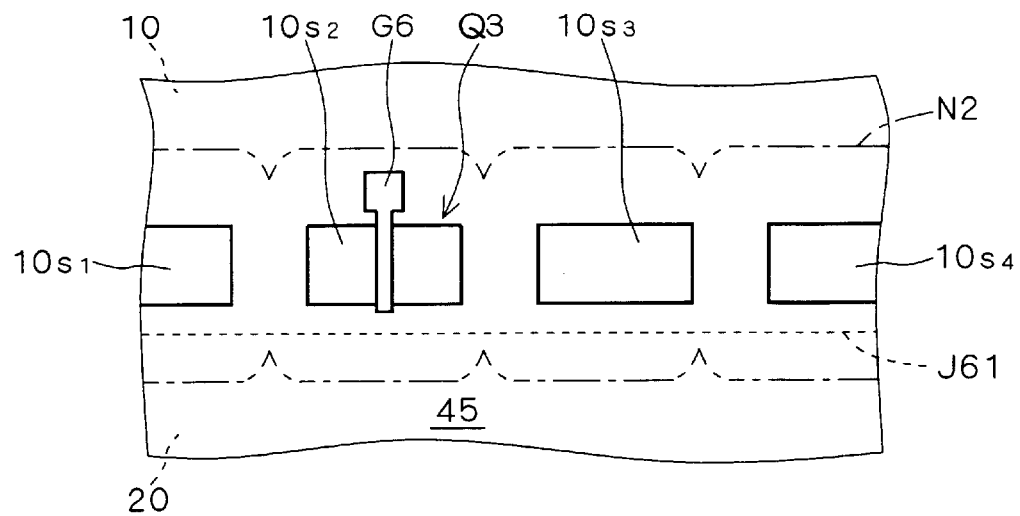

FIG. 11 is a plan view exemplifying the case that a silicide film is formed which does not serve as an electrode of the semiconductor device. The semiconductor layers 10 and 20 form a pn junction J61. A partial isolator 45 covers part of the surfaces of the semiconductor layers 10 and 20 on which silicide films $10s_1$ to $10s_4$ are not formed with the exception to be described later. In other words, the silicide films $10s_1$ to $10_{s4}$ are formed on the surface of the semiconductor layer 10 at a position selectively exposed by the partial isolator 45 with the exception to be described later.

The silicide films $10s_1$, $10s_3$ and $10s_4$ do not serve as electrodes of the semiconductor device, and the silicide film $10s_2$ functions as source/drain of a transistor Q6. The exception mentioned above is the semiconductor layer 10 below a gate G6 of the transistor Q6. Though not covered by the partial isolator 45, this part of the semiconductor layer 10 is covered by the gate G6, which is therefore not silicided.

In this way, the silicide films $10s_1$, $10s_3$ and $10_{s4}$ which do not serve as electrodes of the semiconductor device also contain the pn junction J61 in a region defined by a boundary N2 not more than 2 μm from the silicide films, thereby performing the function of reducing the leakage current.

Of course, the active regions 31a, 31b, the silicide films 10s and 20s do not need to be rectangular. A partial isolator may or may not be formed on the surfaces of the semiconductor layers 10 and 20 on which the silicide films 10s and 20s are not formed.

In view of the fact that the defect density is very low at a position within the range 2 μm from the end of the partial isolator or the silicide films, the above-described basic idea of the present invention employs a structure in which a pn junction is not positioned beyond the above position, thereby reducing the leakage current.

First Preferred Embodiment

Figure 12:
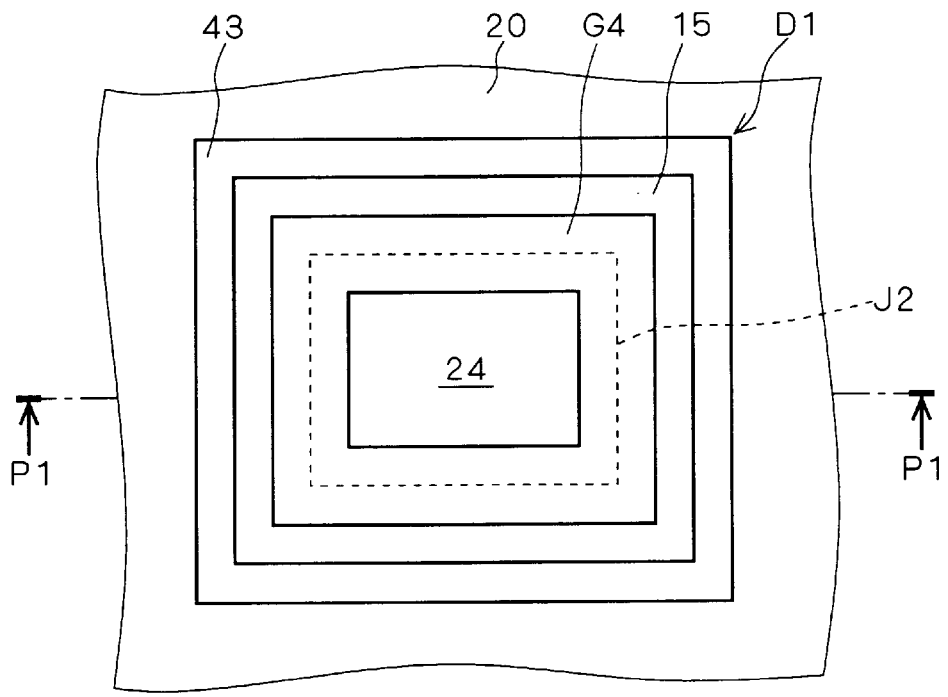
FIG. 12 is a plan view showing a structure of a semiconductor device according to a first preferred embodiment of the present invention.
Figure 13:
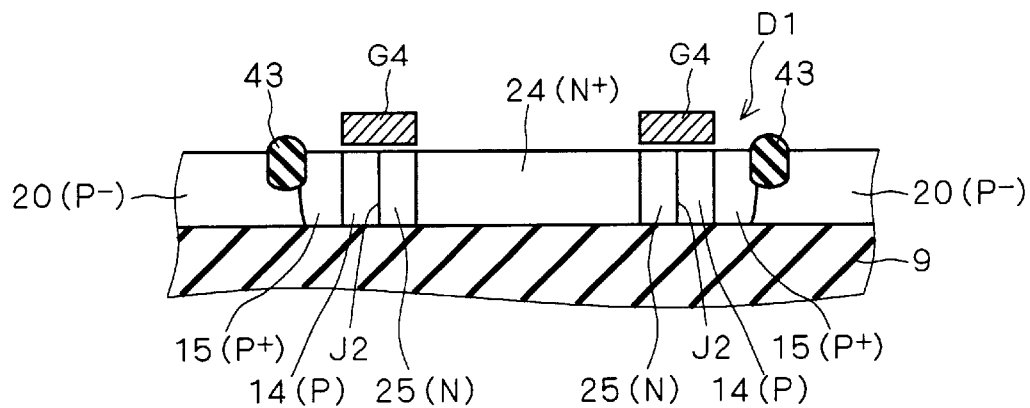
FIG. 13 is a sectional view showing the structure of the semiconductor device according to the first preferred embodiment.

FIG. 12 is a plan view showing a structure of a diode D1 being a semiconductor device according to the present embodiment. FIG. 13 is a sectional view taken along the line P1—P1 shown in FIG. 12. A P⁻ type semiconductor layer 20 is provided on the insulator 9.

A partial isolator 43 is provided on a surface of the semiconductor layer 20 on the far side from the insulator 9 in a hollow, substantially rectangular shape, for example, to divide an active region. Provided inside the hollow portion of the partial isolator 43 are a P⁺ type semiconductor layer 15, a P type semiconductor layer 14 having an impurity concentration lower than that of the semiconductor layer 15, an N type semiconductor layer 25 and an N⁺ type semiconductor layer 24 having an impurity concentration higher than that of the semiconductor layer 25, in this order from outside to inside, each of which has a hollow, substantially rectangular shape. All of the semiconductor layers 15, 14, 24 and 25 are in contact with the insulator 9, while being completely exposed on the side where the partial isolator 43 is positioned.

Provided over the semiconductor layers 14 and 25 is a gate G4 that opposes the semiconductor layers 14 and 25 with a gate insulating film (not shown) interposed therebetween. In addition, the semiconductor layers 14 and 25 are in contact with a surface of the insulator 9, while forming a pn junction J2 exposed on the side where the partial isolator 43 is positioned. The semiconductor layers 24 and 15 have a function of making contact with the n side and p side of the pn junction J2, respectively.

Since the pn junction J2 is separated from the partial isolator 43 with the semiconductor layer 15 interposed therebetween, the crystal defect is very small at the pn junction J2 and the leakage current at the diode D1 (reverse bias current) is very low, as described in Basic Idea of the Invention.

Second Preferred Embodiment

Figure 14:
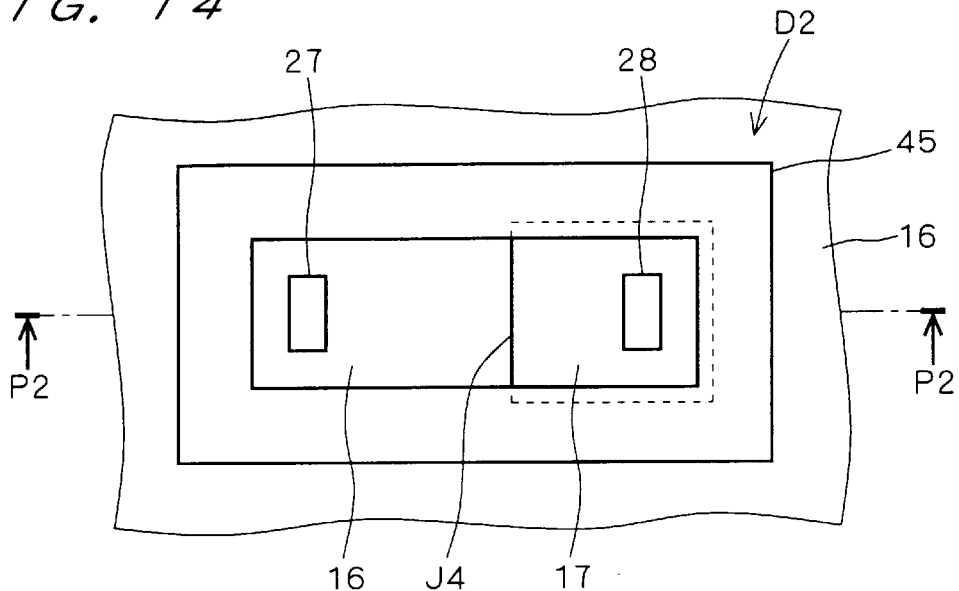
FIG. 14 is a plan view showing a structure of a semiconductor device according to a second preferred embodiment of the present invention.
Figure 15:
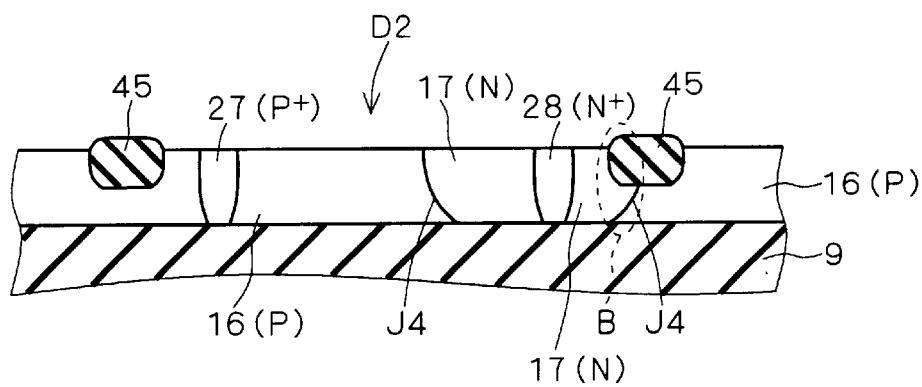
FIG. 15 is a sectional view showing the structure of the semiconductor device according to the second preferred embodiment.

FIG. 14 is a plan view showing a structure of a diode D2 being a semiconductor device according to the present embodiment. FIG. 15 is a sectional view taken along the line P2—P2 shown in FIG. 14. A P type semiconductor layer 16 is provided on the insulator 9.

A partial isolator 45 is provided on a surface of the semiconductor layer 16 on the far side from the insulator 9, in a hollow, substantially rectangular shape, for example, to divide an active region. An N type semiconductor layer 17 is selectively formed inside the hollow portion of the partial isolator 45 and forms a pn junction J4 with the semiconductor layer 16. The pn junction J4 is in contact with the insulator 9, while being exposed on the side where the partial isolator 45 is positioned. However, the pn junction J4 is partly positioned under the partial isolator 45 (on the side of the insulator 9).

Formed inside the semiconductor layer 17 is an N⁺ type semiconductor layer 28 that is in contact with the insulator 9 while being exposed on the side where the partial isolator 45 is positioned. Formed in the semiconductor layer 16 inside the hollow portion of the partial isolator 45 is a P⁺ type semiconductor layer 27 that is in contact with the insulator 9 while being exposed on the side where partial isolator 45 is positioned. The semiconductor layer 27 has the same P type conductivity as that of the semiconductor layer 16 and higher impurity concentration. The semiconductor layer 28 has the same N type conductivity as that of the semiconductor layer 16 and higher impurity concentration. Therefore, the semiconductor layers 28 and 27 have a function of making contact with the n side and p side of the pn junction J4, respectively.

Figure 16:
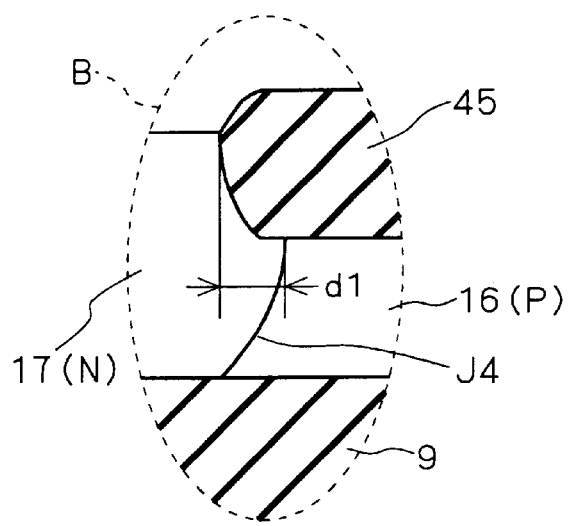
FIG. 16 is an enlarged sectional view showing a part of FIG. 15.

FIG. 16 is an enlarged sectional view showing a region B in the vicinity of the pn junction J4 positioned on the right side in FIG. 15. Provided that a maximum value d1 of a distance between the pn junction J4 and a boundary between the partial isolator 45 and the semiconductor layer 17 is not more than 2 μm, the crystal defect at the pn junction J4 is very small as described in Basic Idea of the Invention. This also applies to a portion of the pn junction J4 which does not appear in FIG. 15. As in the first preferred embodiment, the crystal defect is very small also at the pn junction J4 positioned on the left in FIG. 15, and the leakage current (reverse bias current) at the diode D2 is very low.

Third Preferred Embodiment

Figure 17:
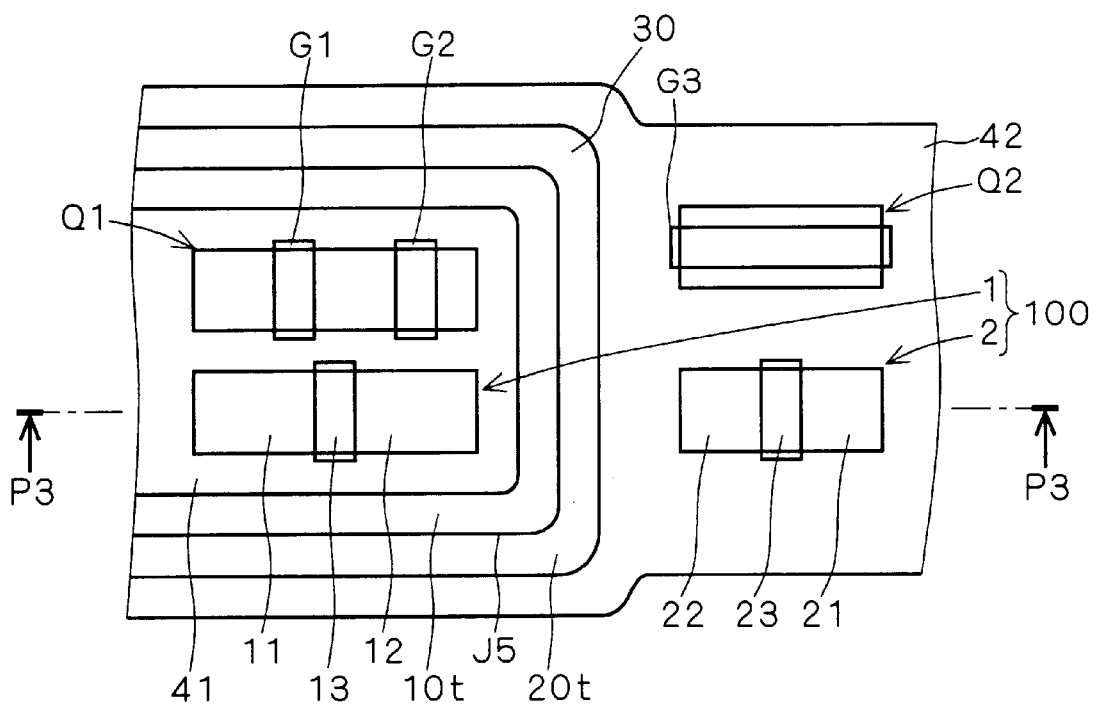
FIG. 17 is a plan view showing a structure of a semiconductor device according to a third preferred embodiment of the present invention.
Figure 18:
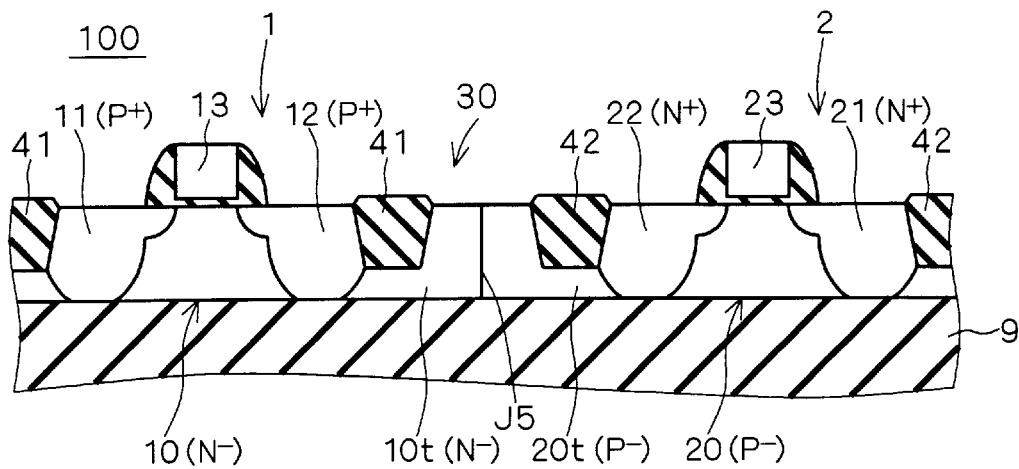
FIG. 18 is a sectional view showing the structure of the semiconductor device according to the third preferred embodiment.

FIG. 17 is a plan view showing a structure of a CMOS transistor 100 being a semiconductor device according to the present embodiment. FIG. 18 is a sectional view taken along the line P3—P3 shown in FIG. 17.

The $N^-$ type semiconductor layer 10 and the $P^-$ type semiconductor layer 20 are formed on the insulator 9. An end 10t of the semiconductor layer 10 and an end 20t of the semiconductor layer 20 form a pn junction J5 that is in contact with the insulator 9 while being exposed on an opposite side to the insulator 9.

Partial isolators 41 and 42 are provided on the surface of the semiconductor layers 16, 20 on the far side from the insulator 9, respectively. Formed in an active region which is divided by the partial isolator 41 are a semiconductor element Q1 including gates G1 and G2, and a PMOS transistor 1. Formed in an active region which is divided by the partial isolator 42 are a semiconductor element Q2 including a gate G3, and an NMOS transistor 2. There is a region 30 on which the pn junction J5 and the ends 10t and 20t are partly exposed between the partial isolator 41 and 42.

Referring to the PMOS transistor 1, $P^+$ type source/drain layers 11 and 12 are formed on the active region which is divided by the partial isolator 41, and a gate electrode 13 is formed on the semiconductor layer 10 with a gate insulating film interposed therebetween. Referring to the NMOS transistor 2, $P^+$ type source/drain layers 21 and 22 are formed on the active region which is divided by the partial isolator 42, and a gate electrode 23 is formed on the semiconductor layer 20 with a gate insulating film interposed therebetween. In the interest of simplicity, the gate insulating films and sidewalls on sides of the gate electrodes 13 and 23 are omitted in FIG. 17.

Figure 62:
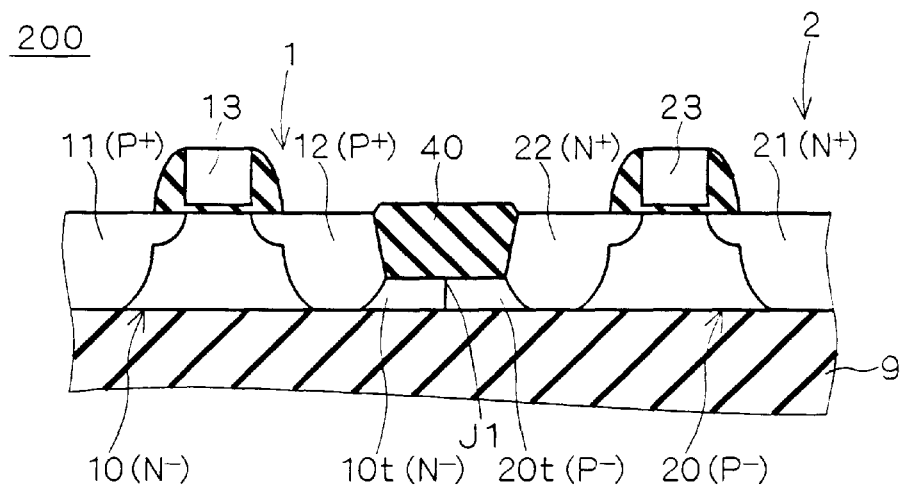
FIG. 62 is a sectional view showing a structure of a conventional CMOS transistor.

In the CMOS transistor 100 formed by the PMOS transistor 1 and the NMOS transistor 2, the pn junction J5, formed by the end 20t of the semiconductor layer 20 having the same P type conductivity as those of the source/drain layers 11 and 12 with lower impurity concentration and by the end 10t of the semiconductor layer 10 having the same N type conductivity as those of the source/drain layers 21 and 22 with lower impurity concentration, is separated from both of the partial isolators 41 and 42. Consequently, the crystal defect is very small at the pn junction J5 as described in Basic Idea of the Invention, which enables to greatly reduce an abnormal leakage current compared to a CMOS transistor 200 shown in FIG. 62.

Referring to FIGS. 17 and 18, the region 30 where the pn junction J5 is positioned is illustrated as a dummy region in which a semiconductor element is not formed. As described in the first and second preferred embodiments, however, it is possible to obtain the effect described in Basic Idea of the Invention also in the case that an element may be formed by a pn junction formed separately from a partial isolator or formed under the partial isolator with a distance not more than 2 μm.

Figure 19:
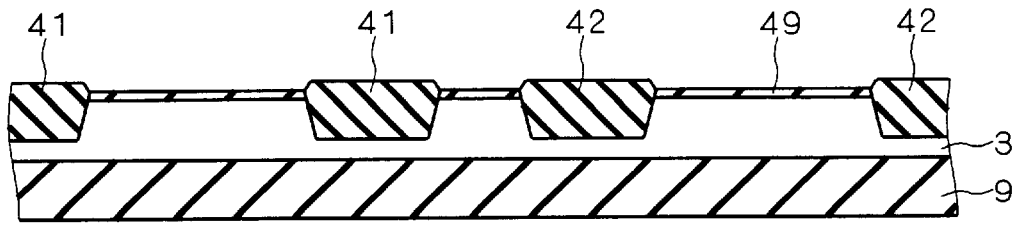
FIGS. 19 through 21 are sectional views showing a method of forming the semiconductor device according to the third preferred embodiment in sequential order of steps.
Figure 20:
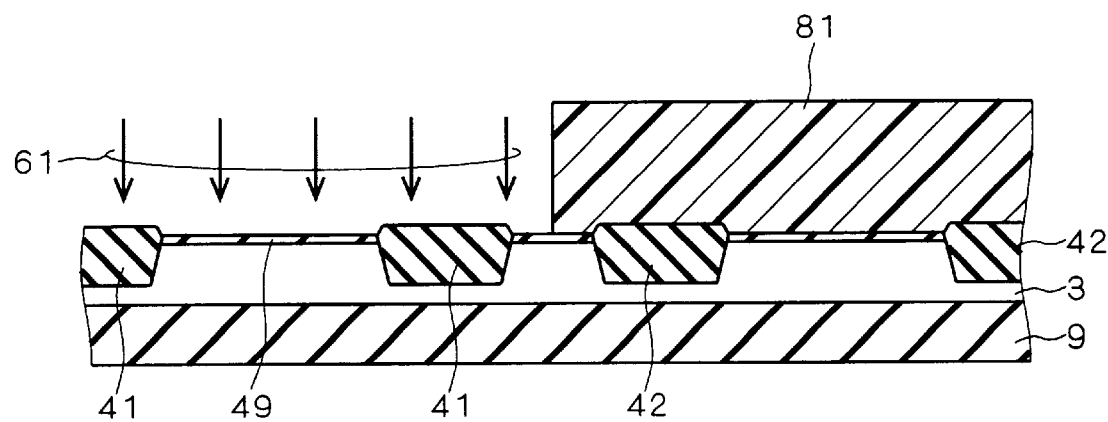
Figure 21:
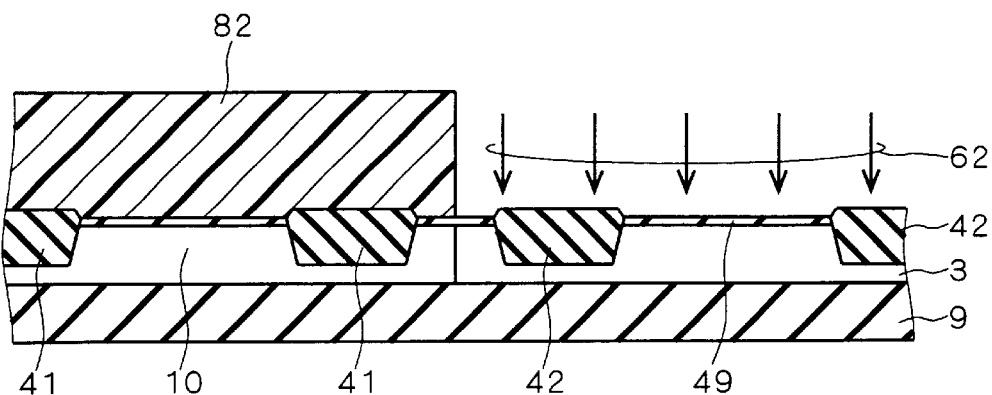

FIGS. 19 to 21 are sectional views showing a method of forming the CMOS transistor 100 in sequential order of steps. A semiconductor film 3 made of single crystalline silicon is mounted on the insulator 9. The insulator is made of an oxide layer, for example. Thereafter, an underlying oxide film 49 is formed entirely on a surface of the semiconductor film 3 that is on the far side from the insulator 9. In addition, the partial isolators 41 and 42 are formed separately from the insulator 9. A structure shown in FIG. 19 is thus obtained. Various methods of forming a partial isolator will be described later. U.S. patent applications Ser. Nos. 09/466,934 and 09/639,953, the disclosures of which are herein incorporated by reference, disclose methods of forming a partial isolator applicable to the partial isolator of this specification.

Referring to FIG. 20, the partial isolator 42 and the semiconductor film 3 which is divided by the partial isolator 42 and on which the NMOS transistor 2 is to be formed later are covered by a resist 81. An ion implantation 61 with phosphorus or arsenic is carried out for the semiconductor film 3 using the resist 81 as a mask through the underlying oxide film 49, or further through the partial isolator 41. By means of the ion implantation 61, a portion under the partial isolator 41 and the semiconductor film 3 which is divided by the partial isolator 41 and on which the PMOS transistor 1 is to be formed later form the $N^-$ type semiconductor layer 10.

Referring to FIG. 21, the $N^-$ type semiconductor layer 10 and the partial isolator 41 are covered by a resist 82. An ion implantation 62 with boron is carried out for the semiconductor film 3 through the underlying oxide film 49, or further through the partial isolator 42. By means of the ion implantation 62, a portion under the partial isolator 42 and the semiconductor film 3 which is divided by the partial isolator 42 and on which the NMOS transistor 2 is to be formed later form the $P^-$ type semiconductor layer 20.

Thereafter, the underlying oxide film 49 is removed and the gate insulating film, gate electrodes 13, 23, source/drain layers 11, 12, 21 and 22 are formed by means of a well-known method, thereby obtaining a structure shown in FIG. 12.

Fourth Preferred Embodiment

Figure 22:
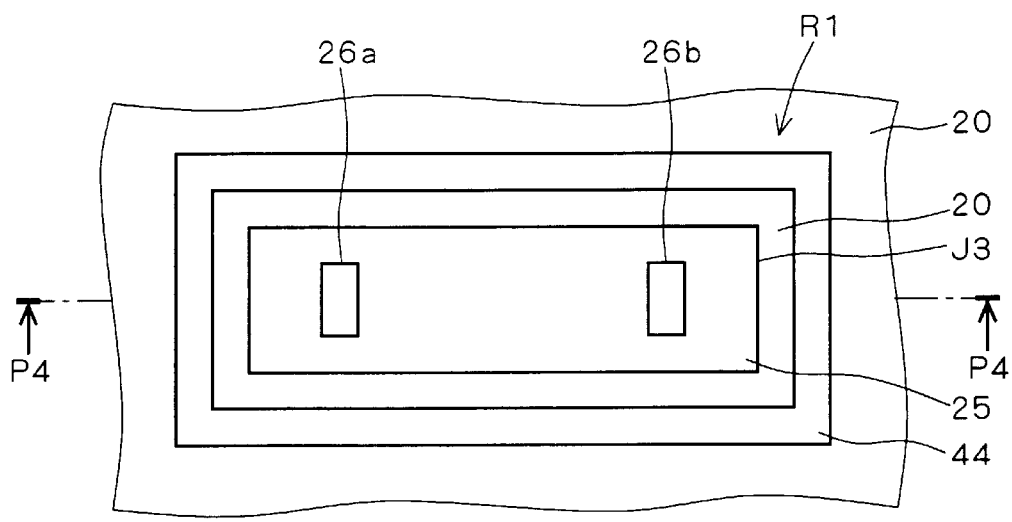
FIG. 22 is a plan view showing a structure of a semiconductor device according to a fourth preferred embodiment of the present invention.
Figure 23:
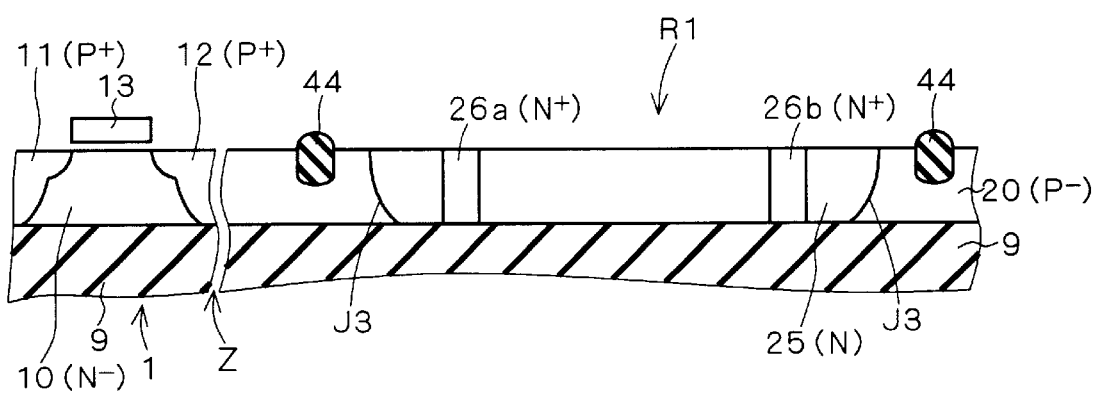
FIG. 23 is a sectional view showing the structure of the semiconductor device according to the fourth preferred embodiment.

FIG. 22 is a plan view showing a structure of a resistor RI being a semiconductor device according to the present embodiment. FIG. 23 is a sectional view showing a cross section taken along the line P4—P4 shown in FIG. 22 and a cross section at a position which does not appear in FIG. 22. The former section is illustrated on the right, and the latter section on the left, adjacently to each other with a fracture portion Z interposed therebetween. The $P^-$ type semiconductor layer 20 is formed on the insulator 9.

A partial isolator 44 is provided on a surface of the semiconductor layer 20 on the far side from the insulator 9, in a hollow, substantially rectangular shape, for example, to divide an active region. An N type semiconductor layer 25 is formed inside the hollow portion of the partial isolator 44 separately from the partial isolator 44. Provided in the semiconductor layer 25 are $N^+$ type semiconductor layers 26a and 26b having the same conductivity type as that of the semiconductor layer 25 and higher impurity concentration. Therefore, the semiconductor layers 26a and 26b have a function of making contact with a resistive element formed by the semiconductor layer 25.

The semiconductor layers 20 and 25 form a pn junction J3 in the present embodiment. Since the pn junction J3 is separated from the partial isolator 44, the conditions described in Basic Idea of the Invention are satisfied and the same effect is obtained. Of course, the leakage current can be reduced as far as the conditions described in Basic Idea of the Invention are satisfied, even when the semiconductor layer 25 is in contact with the partial isolator 44 and the pn junction J3 is partly formed under the partial isolator 44.

The above-described first to third preferred embodiments exemplify the case when there are semiconductor layers, one having a high impurity concentration and the other having a low impurity concentration in each of a pair of conductivity types different from each other, i.e., at least four kinds of semiconductor layers in total, and that a pn junction formed by the pair of semiconductor layers having lower impurity concentrations satisfies the conditions described in Basic Idea of the Invention. However, particularly in the case that a resistor is formed as a semiconductor device as in the present embodiment, the effect described in Basic Idea of the Invention can be obtained without necessarily requiring the above-described four kinds of semiconductor layers.

FIG. 24 is a plan view showing a structure of a resistor R11 being another semiconductor device according to the present embodiment. FIG. 25 is a sectional view taken along the line P41—P41 shown in FIG. 24. The resistor R11 has an N+ type semiconductor layer 251 in place of the N type semiconductor layer 25 in the resistor R1, and does not have the N+ type semiconductor layers 26a and 26b. Wirings 26c and 26d are provided separately on an upper surface of the N+ type semiconductor layer 251. The semiconductor layer 251 has an increased impurity concentration in order to make an ohmic contact between the wirings 26c and 26d.

On the other hand, there are few cases that a resistor is used solely in an integrated circuit. In many cases, a CMOS transistor is also formed, and thus, a PMOS transistor is also formed on the insulator 9. For instance, it may be understood that the above-described four kinds of semiconductor layers are present in an integrated circuit on which the PMOS transistor 1 such as that shown on the left side in FIG. 23, for example, is mounted together with the resistor R1 shown on the right. Of course, it can be understood that the above-described four kinds of semiconductor layers are also present in an integrated circuit in which semiconductor layers forming the resistor have conductivity types opposite to those in the above case and on which the resistor and an NMOS transistor are mounted.

FIG. 26 is a plan view showing a structure of a resistor R2 being another semiconductor device according to the present embodiment. FIG. 27 is a sectional view taken along the line P5—P5 shown in FIG. 26. The resistor R2 has a structure in which the resistor R1 additionally comprises a gate electrode G5 that is opposed to the pn junction J3 and the semiconductor layer 25 with a gate insulating film (not shown) interposed therebetween. Such a structure, of course, can reduce the leakage current.

Fifth Preferred Embodiment

Silicidation of surfaces of the source/drain layers 11, 12, 21 and 22 in the CMOS transistor 100 shown in FIG. 17 would result in silicidation of surfaces of the ends 10t and 20t exposed in the region 30, causing conduction between the semiconductor layers 10 and 20. In order to prevent such a short circuit, it is preferable that an exposed pn junction formed separately from the partial isolators 41 and 42 as the pn junction J5 is covered with an insulator when performing silicidation.

FIG. 28 is a sectional view showing a structure of a semiconductor device according to the present embodiment in which the CMOS transistor 100 shown in FIG. 17 additionally comprises an insulating film 48 covering the region 30. A nitride film, an oxide film or a nitride film having an oxide film as an underlying layer, for example, may be used for the insulating film 48.

The insulating film 48, after being formed all over the structure shown in FIG. 17, may be remained only in the region 30 by patterning. Alternatively, it may be formed in the step of forming sidewalls of the gate electrodes 13 and 23, and thus, it can be made easily. For instance, the insulating film 48 may be remained by covering the region 30 with a mask when anisotropically etching an insulating film to be a material for a sidewall.

Figure 29:
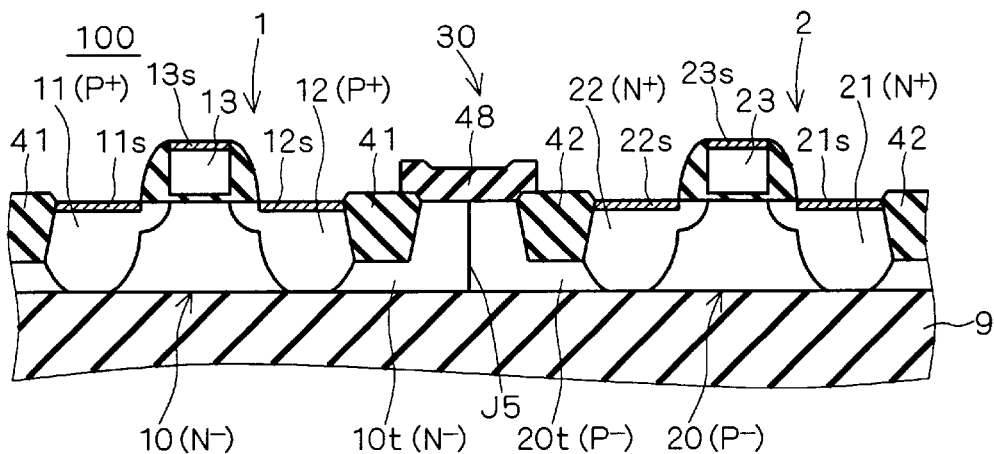

FIG. 29 is a sectional view showing a structure obtained by siliciding the CMOS transistor 100 constructed as shown in FIG. 28. It is possible to form silicide films 13s, 23s, 11s, 12s, 21s and 22s on the surfaces of the gate electrodes 13, 23 and the source/drain layers 11, 12, 21 and 22, respectively. However, the ends 10t and 20t are not exposed so that a silicide film that shorts the both ends is not formed.

When performing the silicidation, it is sufficient to provide a cover for covering the region 30 with a material having an insulative surface that is in contact with the ends 10t and 20t. The cover does not need to be insulative as a whole.

Figure 30:
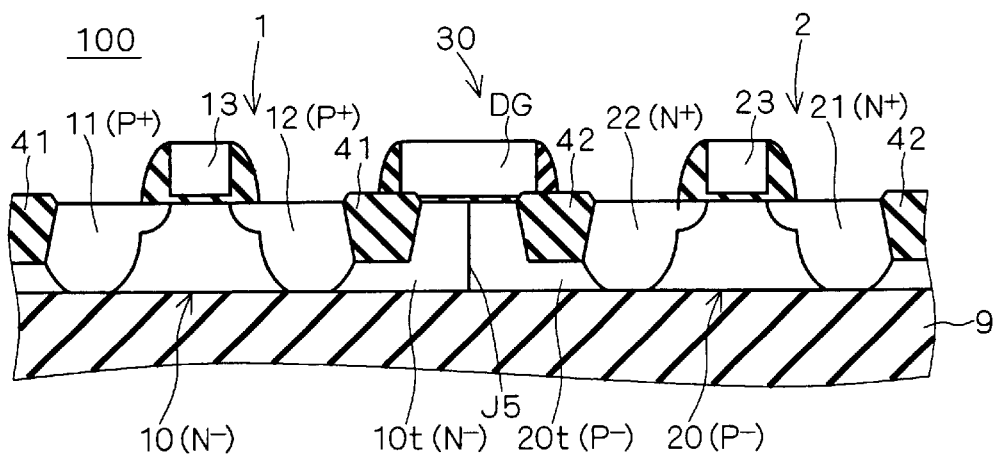
FIGS. 30 and 31 are sectional views showing a method of forming another semiconductor device according to the fifth preferred embodiment in sequential order of steps.

FIG. 30 is a sectional view showing a structure of another semiconductor device according to the present embodiment in which the CMOS transistor 100 shown in FIG. 17 additionally comprises a dummy gate DG covering the region 30. The dummy gate DG has a gate insulating film thereunder similarly to the gate electrodes 13 and 23 so that the ends 10t and 20t are not shorted. Such a structure can be formed in the step of forming the gate insulating film and that of forming the gate electrodes 13 and 23, and thus, it can be made easily. For instance, the gate electrodes 13, 23 and the dummy gate DG are made of polysilicon.

Figure 31:
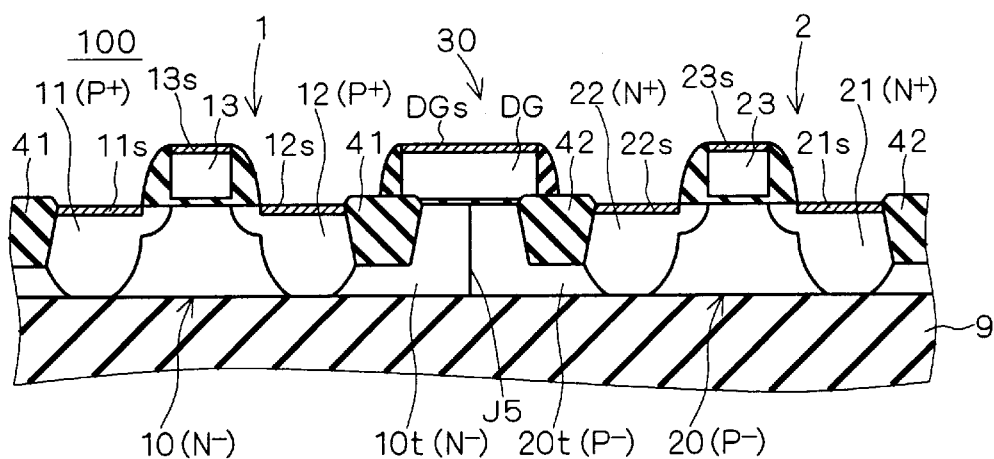

FIG. 31 is a sectional view showing a structure obtained by siliciding the CMOS transistor 100 constructed as shown in FIG. 30. Silicide films 13s, 23s, DGs, 11s, 12s, 21s and 22s can be formed on the surfaces of the gate electrodes 13, 23, the dummy gate DG, and the source/drain layers 11, 12, 21 and 22, respectively. However, the ends 10t and 20t are not exposed so that a silicide film that shorts the both ends is not formed.

Figure 32:
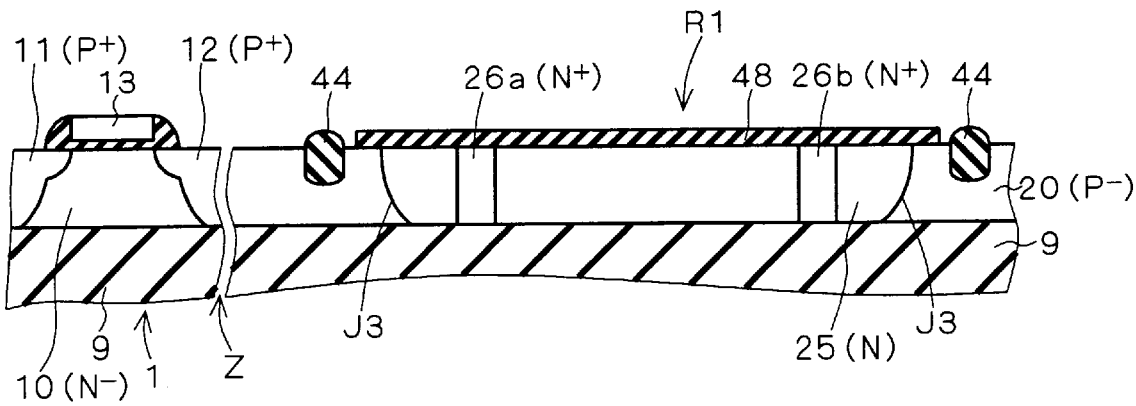
FIGS. 32 through 34 are sectional views showing a structure of a resistor according to the fifth preferred embodiment.
Figure 33:
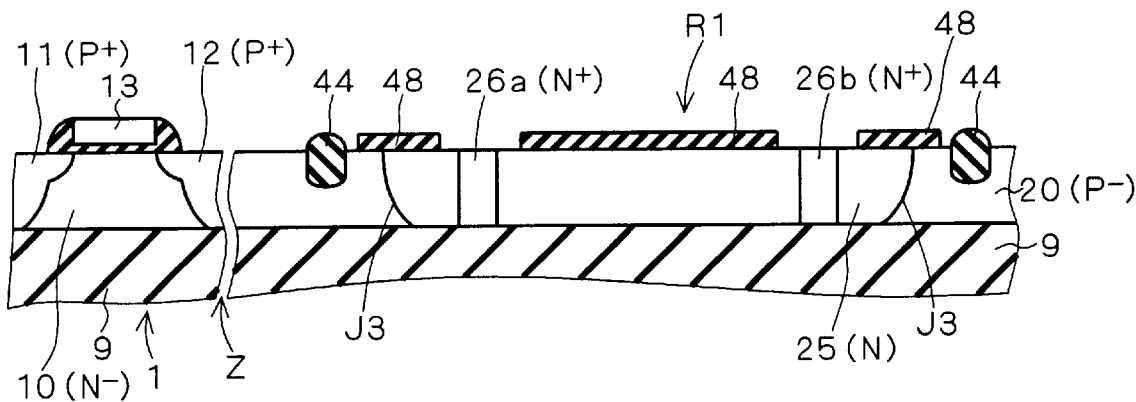
Figure 34:
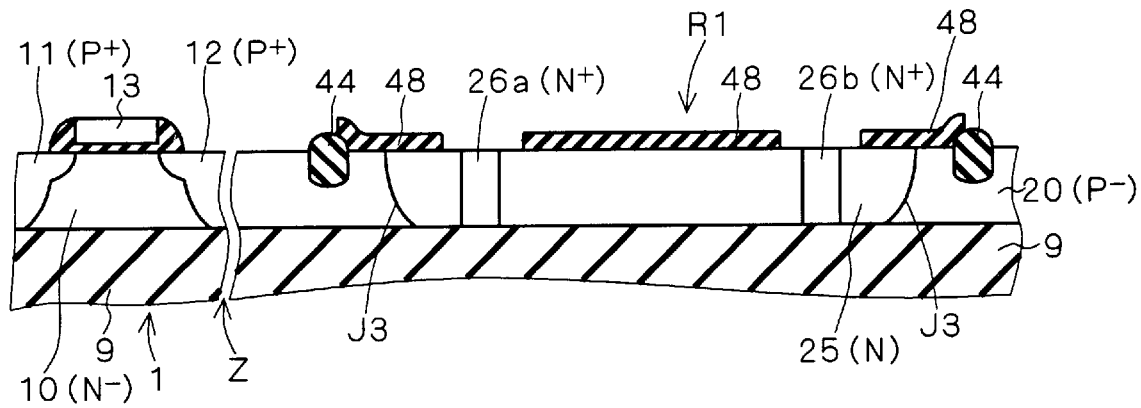

As described above, when performing silicidation, it is preferable to provide the above-noted cover on the pn junction formed separately from the partial isolator. This is true for the pn junction J3 of the resistor R1, and the pn junction J3 is prevented from being shorted at silicidation. It is sufficient that the insulating film 48 at least covers the junction J3. As shown in FIG. 32, after being covered with the insulating film 48, the semiconductor layer 26 may be exposed by making an opening on the insulating film 48. Alternatively, an opening may be previously made on a portion of the insulating film 48 to be silicided later as shown in FIG. 33. Of course, the insulating film 48 may be in contact with the partial isolator 44 as shown in FIG. 34. Referring to the pn junction J42 shown in FIG. 3, it is preferable to provide the above-noted cover for covering a portion of the pn junction J42 exposed in the active regions 31a and 31b.

Referring to a pn junction covered by a partial isolator, however, the pn junction J41 shown in FIG. 3, the pn junction J43 shown in FIG. 4 and the pn junction J45 shown in FIG. 5, for example, are formed on the side of the insulator 9 with respect to the partial isolator 45. Thus, the junctions are not exposed so that there is an advantage that the above-noted cover is unnecessary. Moreover, even in the case that a wiring is laid on such a pn junction, the presence of the partial isolating allows reduction in parasitic capacitance of the wiring.

Sixth Preferred Embodiment

Figure 35:
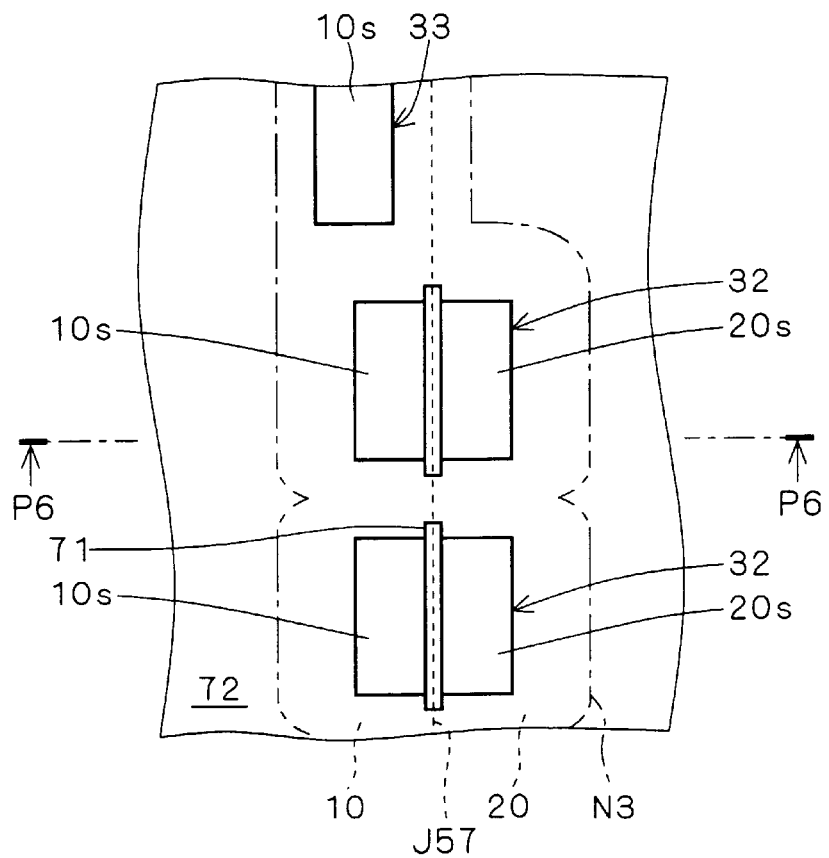
FIG. 35 is a plan view showing a structure of a semiconductor device according to a sixth preferred embodiment of the present invention.
Figure 36:
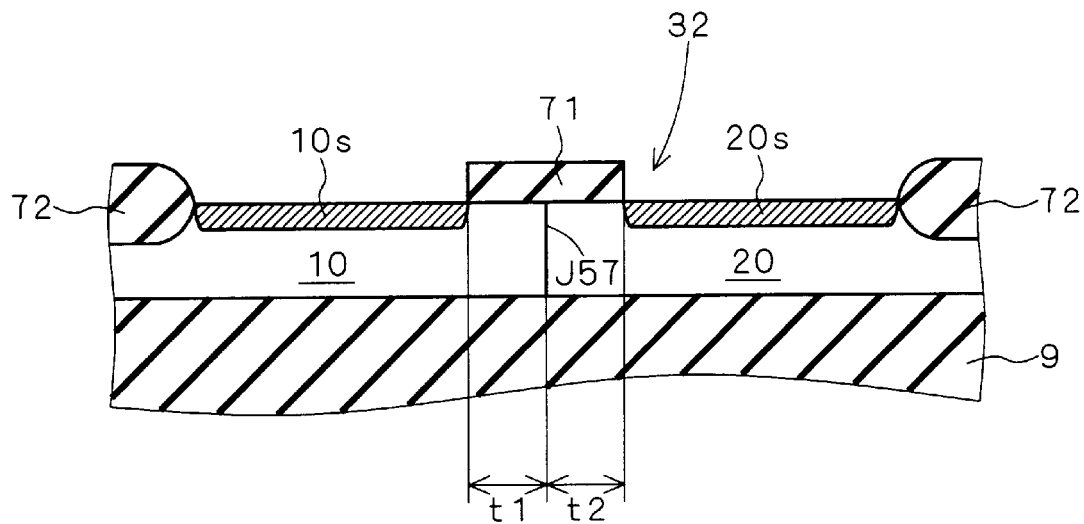
FIG. 36 is a sectional view showing the structure of the semiconductor device according to the sixth preferred embodiment.

FIG. 35 is a plan view exemplifying an arrangement of a pn junction and a silicide film according to the present embodiment. FIG. 36 is a sectional view taken along the line P6—P6 shown in FIG. 35. The semiconductor layers 10 and 20 function as, for example, an N well and a P well, respectively, and form a pn junction J57. A partial isolator 72 having opening windows 32 and 33 is formed on the semiconductor layers 10 and 20. The opening window 32 is provided to straddle the pn junction J57, and the opening window 33 is provided on the semiconductor layer 10.

The semiconductor layers 10 and 20, silicided at the opening windows 32 and 33, have the silicide layers 10s and 20s, respectively, on their surfaces. The opening window 32 is formed to straddle the pn junction J57. It is necessary to prevent short circuit of the silicide films 10s and 20s in order to prevent short circuit in the pn junction 57. Thus, in order to prevent short circuit of the silicide films 10s and 20s, an insulating film 71 to be a mask for preventing silicidation is provided on the pn junction J57 at the opening window 32. Silicidation is thereafter performed.

Referring to FIG. 36, if at least one of the distance t1 from an end of the silicide film 10s to the pn junction J57 in a direction toward the silicide film 20s and the distance t2 from an end of the silicide film 20s to the pn junction J57 in a direction toward the silicide film 10s is not more than τ=2 μm, the effect of the present invention is obtained. To reduce the leakage current, it is preferable that the relation t1≦τ or t2≦τ should be satisfied at all the positions where the pn junction J57 extends. When regions 2 μm from the silicide films 10s and 20s, respectively, are formed to be connected to each other, the silicide films 10s, 20s and the insulating film 71 may not necessarily continue in the extending direction of the pn junction J57. FIG. 35 shows the case that the silicide films 10s and 20s are adjacent to each other in the extending direction of the pn junction J57 to the extent that the boundaries N3 2 μm from the silicide film 10s and 20s, respectively, are connected to each other. Thus, in this case, the insulating film 71 does not need to be provided continuously in the extending direction of the pn junction J57.

In the present embodiment, the insulating film 71 for covering the pn junction J57 is provided to the opening window 32 opened by the partial isolator 72 to straddle the pn junction J57. The semiconductor layers 10 and 20 are silicided using the insulating film 71 as a mask, which allows reduction of the leakage current at the pn junction J57.

Figure 37:
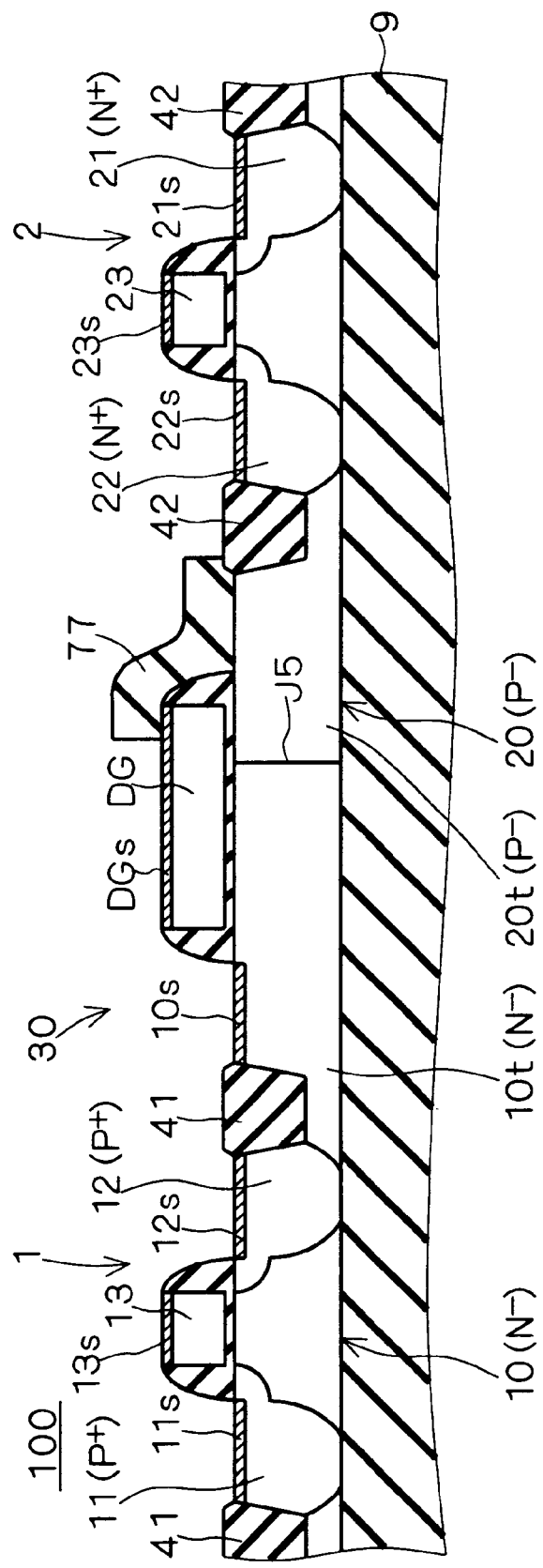
FIGS. 37 through 39 are sectional views showing another structure of the semiconductor device according to the sixth preferred embodiment.

A dummy gate may be employed as a mask for preventing the pn junction from silicidation in place of an insulating film. FIG. 37 is a sectional view taken along the line P3—P3 in FIG. 17, which shows the similar structure to that shown in FIG. 31. The difference from the structure of FIG. 31 lies in that the dummy gate DG does not cover all of the region 30, nor the semiconductor layers 10t, 20t, and that an insulating film 77 covers the semiconductor layer 20t at the region 30. FIG. 37 exemplifies the case that a sidewall is added to the dummy gate DG.

Silicidation is performed using such dummy gate DG and insulating film 77, so that the silicide film 10s is formed on the surface of the semiconductor layer 10t at the region 30. If the distance between the silicide film 10s and the pn junction J5 is not more than 2 μm, a silicide film does not need to be formed on the semiconductor layer 20t as in FIG. 37, which allows reduction in parasitic capacitance.

Figure 38:
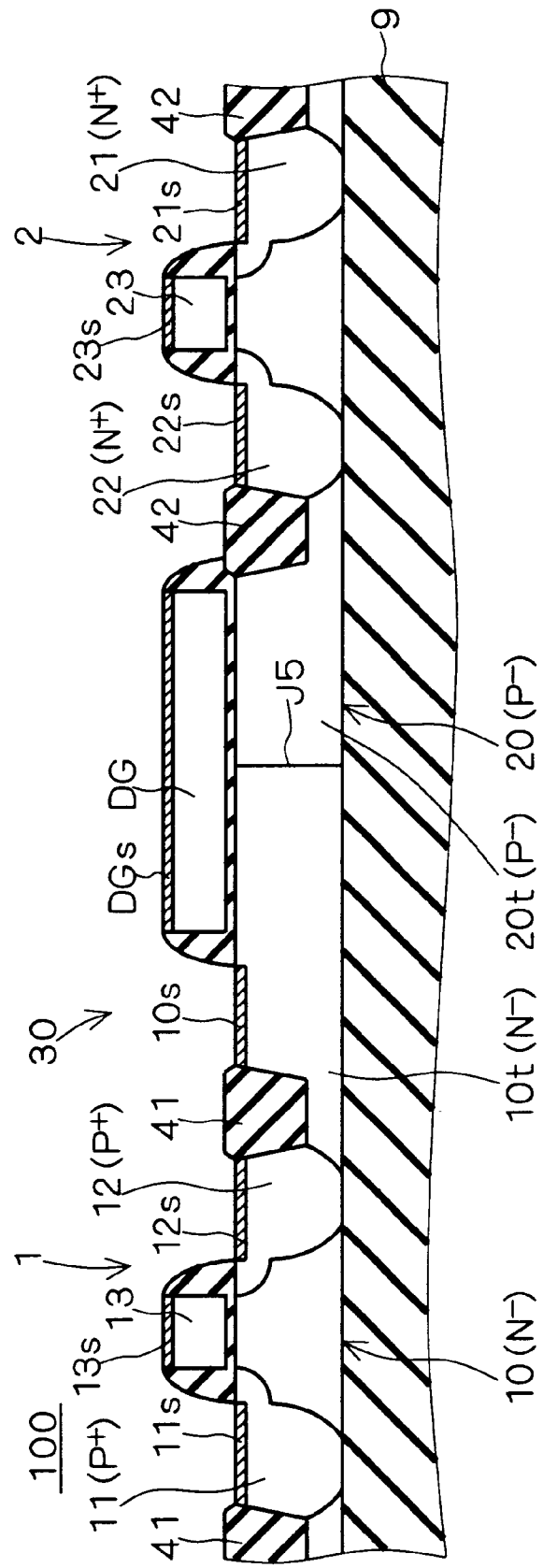
Figure 39:
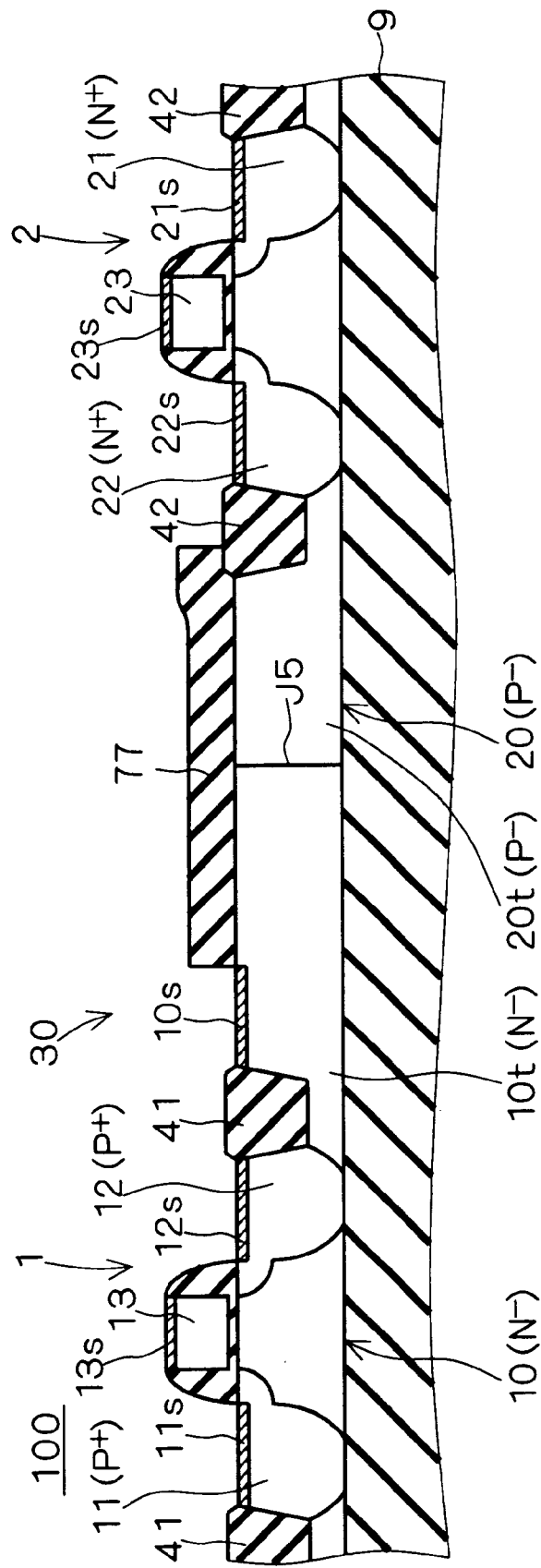

Of course, the semiconductor layer 20t may be covered by the dummy gate DG as shown in FIG. 38, or alternatively, both of the pn junction J5 and the semiconductor layer 20t may be covered by the insulating film 77 as shown in FIG. 39.

Seventh Preferred Embodiment

Figure 40:
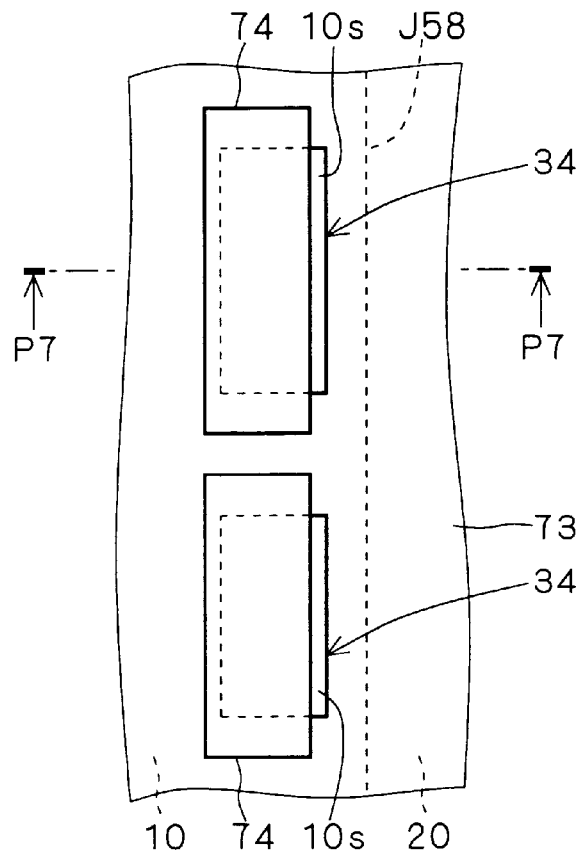
FIG. 40 is a plan view showing a structure of a semiconductor device according to a seventh preferred embodiment of the present invention.
Figure 41:
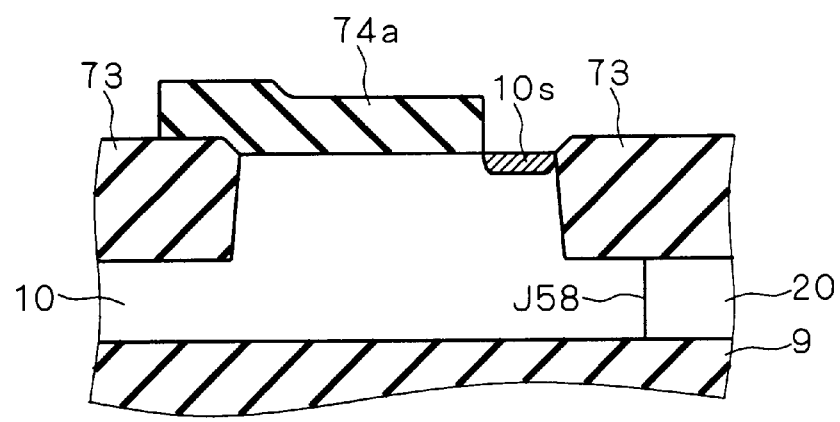
FIG. 41 is a sectional view showing the structure of the semiconductor device according to the seventh preferred embodiment.
Figure 42:
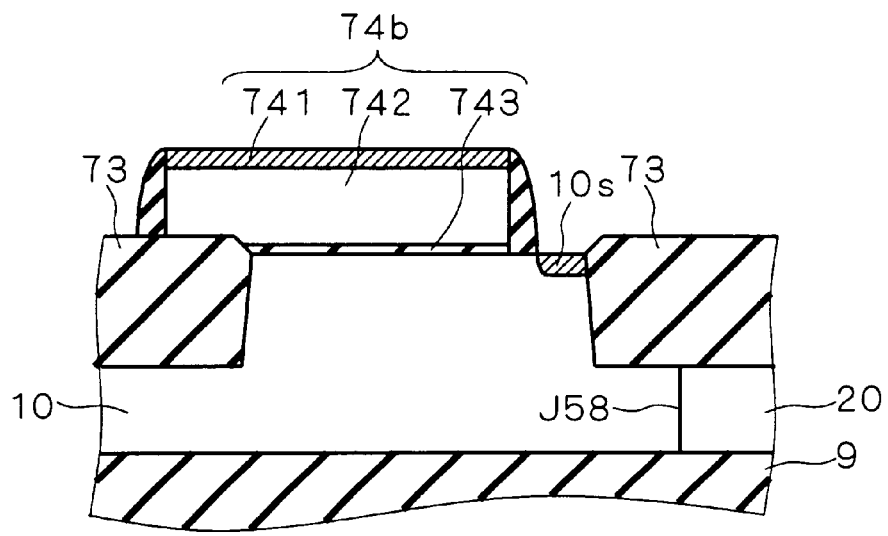
FIG. 42 is a sectional view showing another structure of the semiconductor device according to the seventh preferred embodiment.

FIG. 40 is a plan view exemplifying an arrangement of a pn junction and a silicide film according to the present embodiment. FIGS. 41 and 42 are sectional views showing two exemplary sections at the position taken along the line P7—P7 shown in FIG. 40. The semiconductor layers 10 and 20 function as, for example, an N well and a P well, respectively, and form a pn junction J58. A partial isolator 73 is formed on the semiconductor layers 10 and 20, and exposes the semiconductor layer 10 and the silicide film 10s at an opening window 34.

The opening window 34 is selectively covered by a mask 74. FIGS. 41 and FIG. 42 show the cases of employing an insulating film 74a and a dummy gate 74b, respectively, as the mask 74.

Referring to FIG. 41, the insulating film 74a selectively exposes the semiconductor layer 10 in conjunction with the partial isolator 73, similarly to the insulating film 71 shown in FIG. 36 according to the sixth preferred embodiment, and functions as a mask for preventing silicidation.

The silicide film does not need to be formed on the entire surface of a semiconductor layer which is not covered by a partial isolator. It is sufficient if the silicide film is formed at such a position that the pn junction is provided in a range of distance 2 μm from the position. Such a selective silicidation of the surface of the semiconductor layer reduces an area to be silicided. This allows reduction in parasitic capacitance between the silicide film and another conductor such as wiring provided over the silicide film.

Referring to FIG. 42, before silicidation, the dummy gate 74b includes: an insulating film 743 formed in the step of forming a gate insulating film of another MOS transistor not shown; and a conductive film 742 formed in the step of forming a gate electrode of the MOS transistor. When siliciding the semiconductor layer 10, the dummy gate 74b functions as a mask for preventing silicidation of the semiconductor layer 10, while a silicide film 741 is formed on a surface of the conductive film 742. This allows the gate of the MOS transistor and the dummy gate 74b to have the same structure in the thickness direction. Comparing to the insulating film 74a, the use of the dummy gate 74b as a mask at silicidation of the semiconductor layer 10 allows the structure on the semiconductor layer 10 to have a uniform thickness, whether the semiconductor layer 10 functions as a dummy or is provided with the MOS transistor. Accordingly, it is possible to improve flatness of an interlayer insulating film to be formed on the semiconductor layer 10.

Eighth Preferred Embodiment

Figure 43:
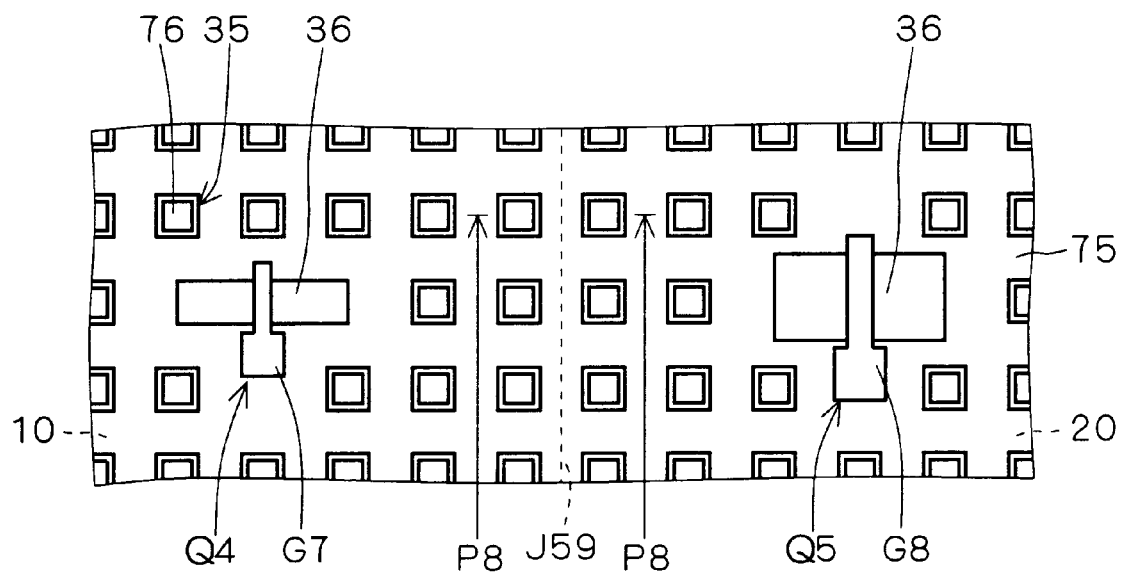
FIG. 43 is a plan view showing a structure of a semiconductor device according to an eighth preferred embodiment of the present invention.
Figure 44:
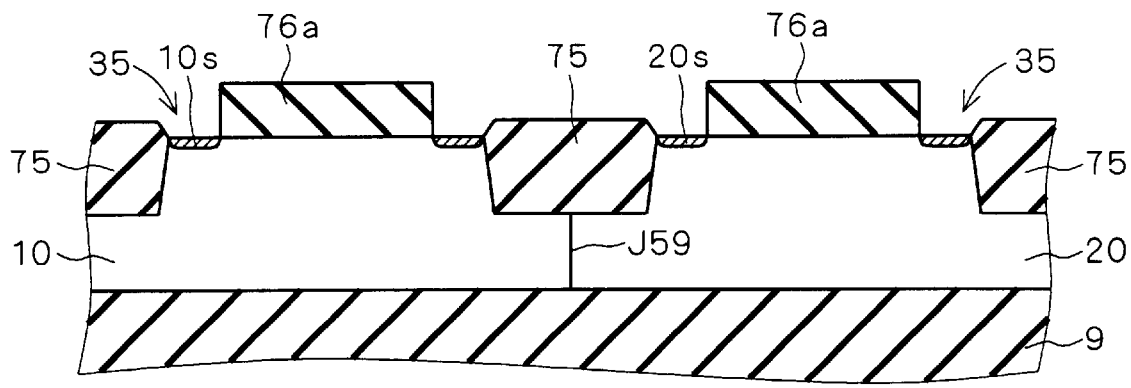
FIG. 44 is a sectional view showing the structure of the semiconductor device according to the eighth preferred embodiment.
Figure 45:
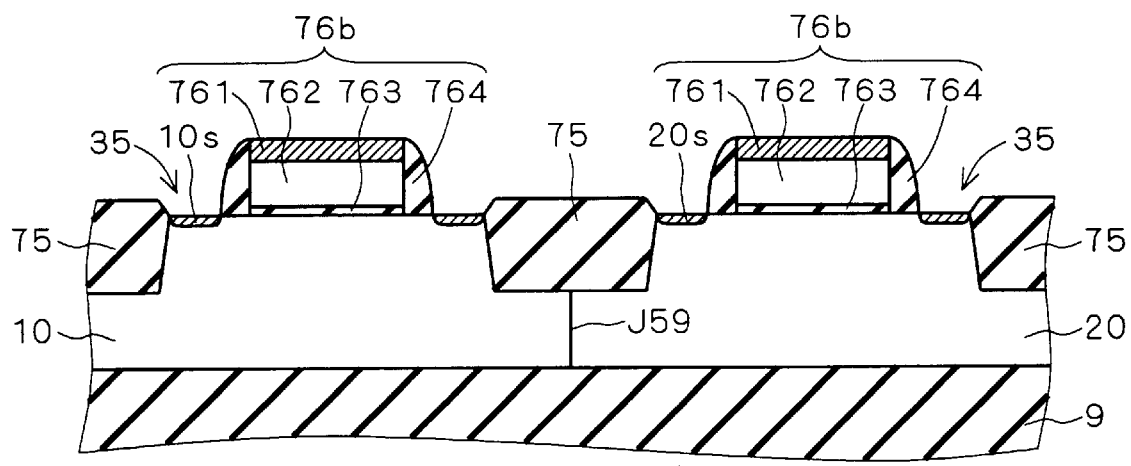
FIG. 45 is sectional view showing another structure of the semiconductor device according to the eighth preferred embodiment.

FIG. 43 is a plan view exemplifying an arrangement of a pn junction and a silicide film according to the present embodiment. FIGS. 44 and 45 are sectional views showing two exemplary sections at the position taken along the line P8—P8 shown in FIG. 43. The semiconductor layers 10 and 20 function as, for example, an N well and a P well, respectively, and form a pn junction J59. A partial isolator 75 having opening windows 35 and 36 is formed on the semiconductor layers 10 and 20.

A PMOS transistor Q4 and an NMOS transistor Q5 are formed on the semiconductor layers 10 and 20, respectively, at the opening 36. The opening window 35 is covered by a mask 76 except its edge.

The semiconductor layers 10 and 20 can be seen from the partial isolator 75 through the opening window 35 which serves as a dummy, on which no semiconductor device is formed. Any dummy of any size and shape may be employed. In FIG. 43, the square opening window 35 is employed, and a plurality of the opening windows are provided in a matrix form except for the positions occupied by the transistors Q4 and Q5. The arrangement of the opening windows 35 with such a pattern can easily be realized by automatic pattern arrangement. However, needless to say the opening window 36, at which the transistors Q4 and Q5 are formed, the opening windows 35 are not provided to straddle the pn junction J59 in the present embodiment.

FIG. 44 and FIG. 45 show the cases of employing an insulating film 76a and a dummy gate 76b, respectively, as the mask 76.

Referring to FIG. 44, the insulating film 76a selectively exposes the semiconductor layer 10 in conjunction with the partial isolator 75, similarly to the insulating film 71 shown in FIG. 36 according to the sixth preferred embodiment, and functions as a mask for preventing silicidation. To obtain the same effect as in the seventh preferred embodiment, the opening window 35 may be formed at such a position that the pn junction is provided in a range of distance 2 82 m from the position.

Referring to FIG. 45, before silicidation, the dummy gate 76b includes: an insulating film 763 formed in the step of forming gate insulating films of the transistors Q4 and Q5; a conductive film 762 formed in the step of forming gate electrodes of the transistors; and a sidewall 764 formed in the step of forming sidewalls of the transistors. When siliciding the semiconductor layers 10 and 20, the dummy gate 76b functions as a mask for preventing silicidation of the semiconductor layers 10 and 20, while a silicide film 761 is formed on a surface of the conductive film 762. The dummy gate 76b, when used as a mask for preventing silicidation of the semiconductor layers 10 and 20, can be formed in the same height as gates G7 and G8 of the transistors Q4 and Q5. Accordingly, it is possible to improve flatness of the interlayer insulating film as in the seventh preferred embodiment.

Formation of a Partial Isolator

Various methods of forming a partial isolator will be described below. The partial isolators explained in the above preferred embodiments may be formed by the following methods.

Figure 46:
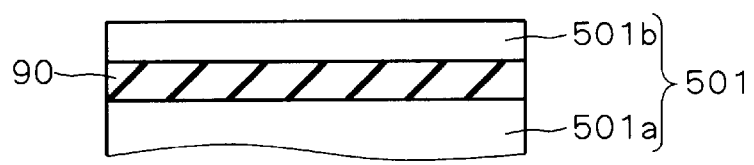
Figure 47:
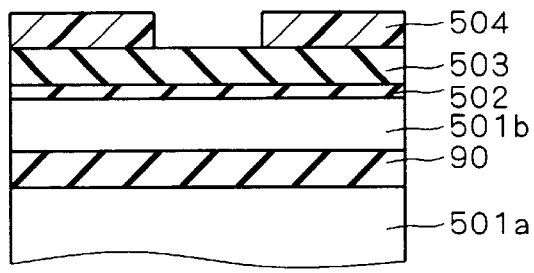

FIGS. 46 through 51 are sectional views showing a first method of forming a partial isolator in sequential order of steps. First, a semiconductor substrate 501 is prepared, and a buried oxide film 90 is formed therein using a method such as SIMOX method accompanied by an ion implantation with oxygen, or the like. The buried oxide film 90 divides the semiconductor substrate 501 in the thickness direction thereof into semiconductor layers 501a and 501b. The structure shown in FIG. 46 is thus obtained. For instance, the buried oxide film 90 and the semiconductor layer 501b correspond to the above-described insulator 9 and the semiconductor film 3 and, for example, are set to be 100 to 400 nm and 50 to 200 nm in thickness, respectively. Of course, a structure shown in FIG. 32 may be obtained by using a bonding method.

Next, an oxide film 502 having a thickness of 20 nm and a nitride film 503 having a thickness of approximately 200 nm, for example, are deposited on the semiconductor layer 501b. Further formed thereon is a resist 504 that has an opening, thereby obtaining a structure shown in FIG. 47. The oxide film 502 may be formed either by CVD method or by heat oxidation of the semiconductor layer 501b. The nitride film 503 may be formed by CVD method, and may be substituted with a nitride oxide film.

Figure 48:
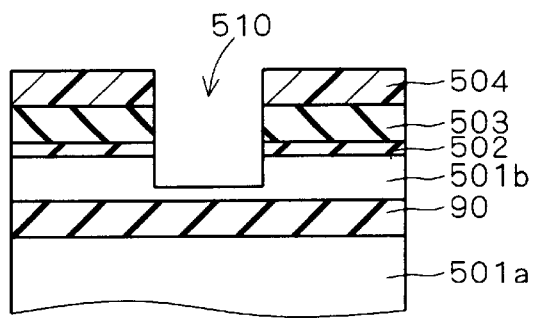

Subsequently, the nitride film 503 and oxide film 502 are etched using a resist 504 as a mask. The semiconductor layer 501b is further etched to reduce its thickness while remained on the buried oxide film 90. A trench 510 shown in FIG. 48 is thus obtained.

Figure 49:
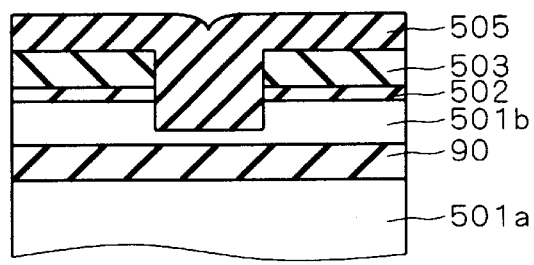

The resist 504 is then removed, and an oxide film 505 is deposited from the side of the trench 510 in a thickness sufficient for burying the trench 510 (e.g., 500 nm), thereby obtaining a structure shown in FIG. 49.

Figure 50:
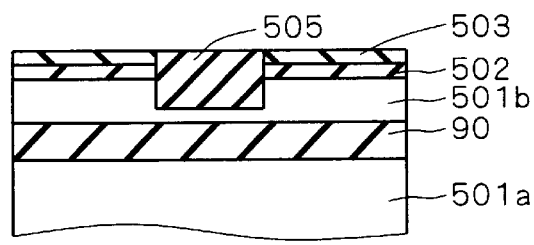

CMP processing is then carried out in a similar manner to a conventional trench isolation for polishing the nitride film 503 as well to reduce its thickness. A structure shown in FIG. 50 is thus obtained.

The nitride film 503 and oxide film 502 are etched and removed. Thereby, as shown in FIG. 51, the oxide film 505 remained on a surface of the semiconductor layer 501b provided on the buried oxide film 90 functions as a partial isolator.

FIGS. 52 through 56 are sectional views showing a second method of forming a partial isolator in sequential order of steps. A structure shown in FIG. 33 is obtained in the same way as the first method of forming the partial isolator. Thereafter, the nitride film 503, oxide film 502 and semiconductor layer 501b are etched using the resist 504 as a mask, thereby forming a trench 511 that exposes the buried oxide film 90. A structure shown in FIG. 52 is thus obtained.

The resist 504 is then removed to deposit a semiconductor layer 506 at least covering the buried oxide film 90 which is a bottom of the trench 511, which covers, for example, the bottom and an inner wall of the trench 511 and a surface of the nitride film 503. Polysilicon is used for the semiconductor layer 506, for example, when the semiconductor substrate 501 is made of silicon. The oxide film 505 is then deposited on the semiconductor layer 506 for burying the trench 511 with the semiconductor layer 506 interposed therebetween. A structure shown in FIG. 53 is thus obtained.

CMP processing is then carried out in a similar manner to the conventional trench isolation for polishing the nitride film 503 as well to reduce its thickness, thereby obtaining a structure shown in FIG. 54.

Figure 55:
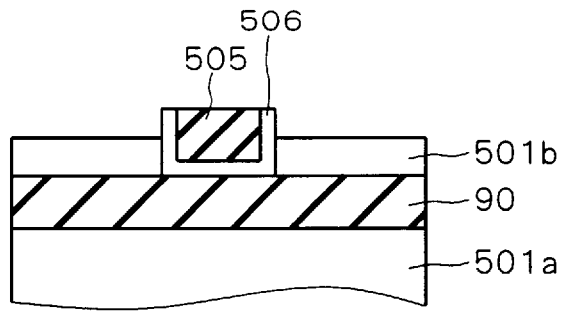

The nitride film 503 and the oxide film 502 are etched and removed, thereby obtaining a structure shown in FIG. 55.

Figure 56:
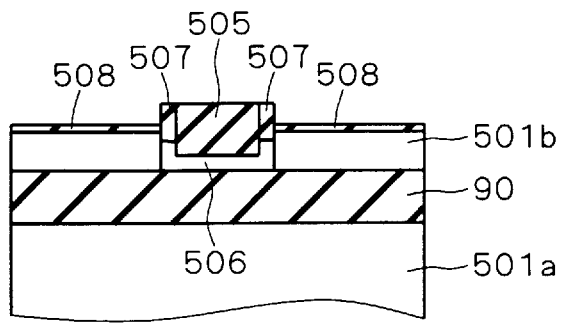

Thereafter, an oxidation treatment is given so that a surface of the semiconductor layer 501b and a portion of the semiconductor layer 506 which are on the far side from the buried oxide film 90 are oxidized and turned into oxide films 508 and 507, respectively. A structure shown in FIG. 56 is thus obtained. The oxide film 508 is then removed to obtain a partial isolator formed by the oxide films 505 and 507. In the present method, the semiconductor layers 506 and 501b remained without being oxidized correspond to the above-noted semiconductor film 3.

Figure 57:
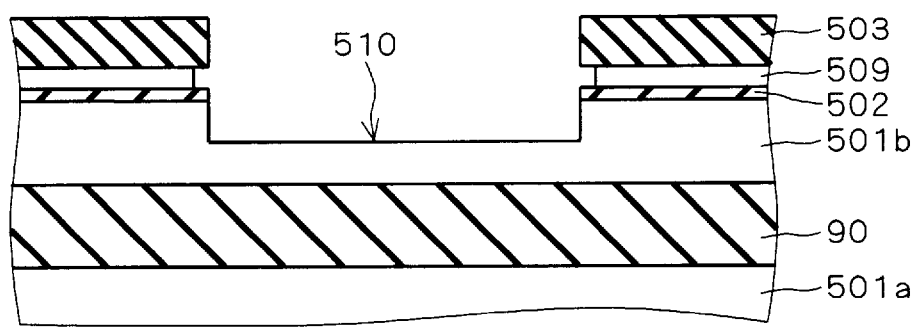
FIGS. 57 through 60 are sectional views showing a third method of forming a partial isolator in sequential order of steps.

FIGS. 57 through 60 are sectional views showing a third method of forming a partial isolator in sequential order of steps. The trench 510 is formed in the same way as in the first method of forming the partial isolator. In the present method, however, a semiconductor layer 509 made of silicon having a thickness of 10 to 100 nm, for example, is interposed between the nitride film 503 and the oxide film 502 (FIG. 57). Retreated from the trench 510 is an end of the semiconductor layer 509 exposed to the trench 510 with the etching of the semiconductor layer 501*b* which is performed when forming the trench 510.

Figure 58:
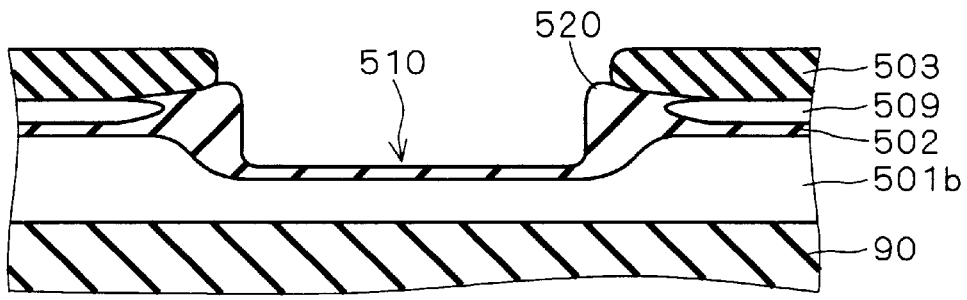

Next, an oxide film 520 is formed on an inner wall of the trench 510 to obtain a structure shown in FIG. 58. The oxide film 502 is formed by heat oxidation at 800 to 1350° C., for example, while the oxide film 520 is formed by wet oxidation at 700 to 900° C. or oxidation in an atmosphere including hydrochloric acid and oxygen. Thereby, the oxide film 520 extends deeply between the semiconductor layer 509 and oxide film 502 and between the oxide film 502 and semiconductor layer 501*b*, which remarkably presents a contour of a so-called bird's beak.

Figure 59:
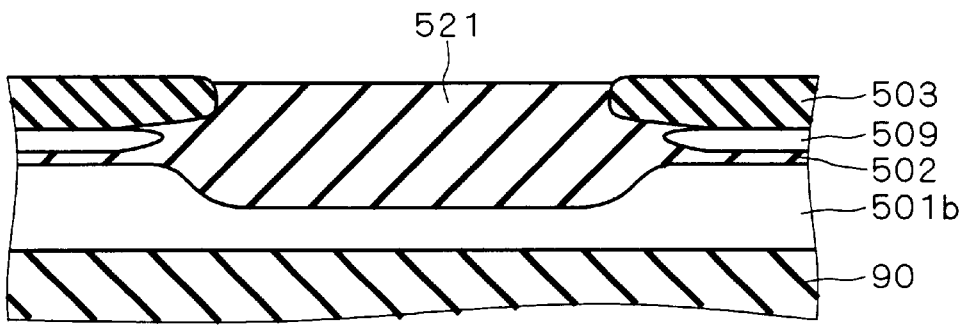
Figure 60:
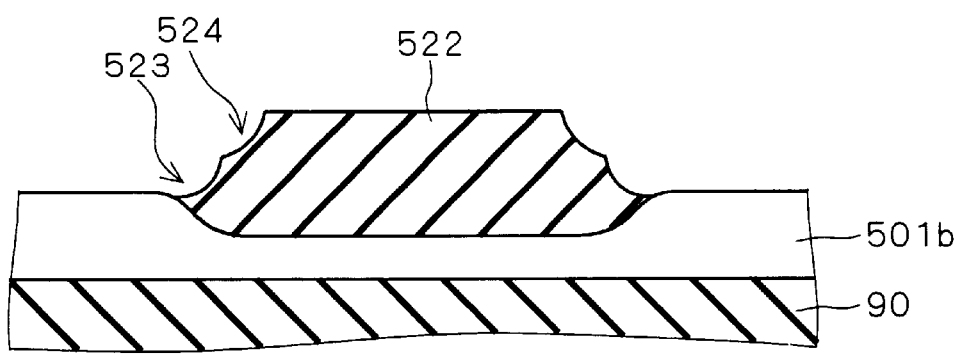

An oxide film 521 is then deposited for burying the trench 510 and flattened by carrying out CMP processing. A structure shown in FIG. 59 is thus obtained. In order that a surface of the oxide film 521 shall not be excessively low also due to an overetching to be described below, an amount of polishing of the oxide film 521 is adjusted in the CMP processing in such a manner that a flat surface of the oxide film 521 is not excessively lower than a main surface of the nitride film 503.

Subsequently, the nitride film 503 and semiconductor layer 509 are removed by wet etching, and the oxide film 502 is further removed by etching. At the etching of the oxide film 502, 50 to 100% of overetching is carried out, so that the contour of the bird's beak of the oxide film 521 is smoothed out and is made correspond to those of the semiconductor layer 509 and nitride film 503, thereby forming depressions 523 and 524, respectively. Thereby, a partial isolator 522 shown in FIG. 60 can be obtained.

Figure 61:
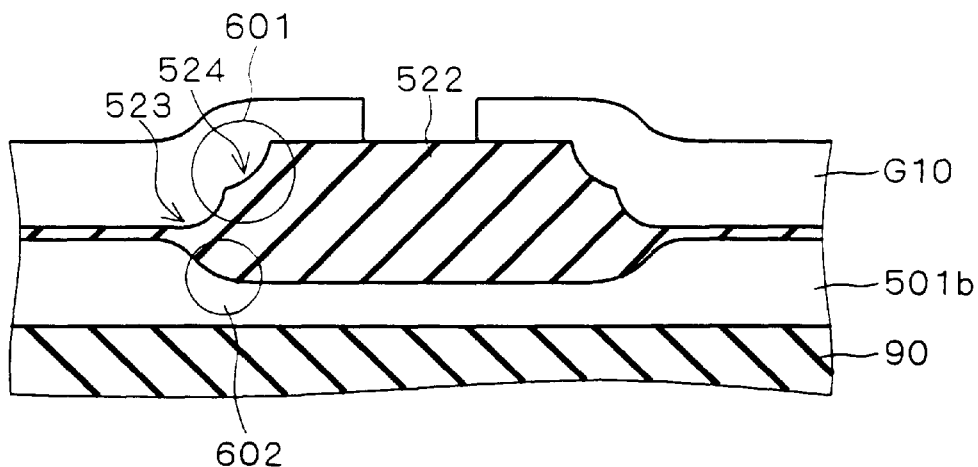
FIG. 61 is a sectional view showing an effect of the partial isolator obtained by the third method.

FIG. 61 is a sectional view showing a structure in which a gate electrode G10 extends over the partial isolator 522. As shown in a position 601, the depressions 523 and 524 are positioned at portions sloping substantially upward in a direction from an end of the bird's beak to the partial isolator 522. This enhances an effect of preventing an unnecessary gate material from remaining on a surface when forming the gate electrode G10, and reduces differences in level in the vicinity of the bird's beak due to the upward slope at the position 601. Consequently, it is easy to form the gate electrode G10.

Further, as shown in a position 602, the partial isolator 522 has a rounded shape projecting to the semiconductor layer 501*b* at a portion sloping downward in a direction from the end of the bird's beak to the partial isolator 522. Accordingly, it is possible to ease stress imposed around an interface between the semiconductor layer 501*b* and the partial isolator 522 due to the heat treatment and oxidation treatment performed in process steps of forming a semiconductor element. This enables to suppresses occurrence of the crystal defect in the semiconductor layer 501*b* due to the stress.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a substrate at least having an insulative surface;
   a semiconductor film provided on said insulative surface of said substrate comprising a first semiconductor layer of a first conductivity type, a second semiconductor layer of said first conductivity type having an impurity concentration lower than that of said first semiconductor layer, a third semiconductor layer of a second conductivity type opposite to said first conductivity type and a fourth semiconductor layer of said second conductivity type having an impurity concentration lower than that of said third semiconductor layer; and
   an insulative isolator formed on a surface of said semiconductor film opposite said substrate, separately from said insulative surface of said substrate, wherein
   said second and fourth semiconductor layers form a pn junction extending across a thickness direction of said semiconductor film and reaching said insulative surface, and
   a maximum distance taken along said insulative surface of said substrate between any point along said pn junction and an end of said insulative isolator is not more than about 2 $\mu$m, when a direction from said end of said insulative isolator along said insulative surface of said substrate is taken as a positive direction.

2. The semiconductor device according to claim 1, wherein said pn junction has a portion separated from said insulative isolator.

3. The semiconductor device according to claim 2, wherein said portion of said pn junction separated from said insulative isolator forms a semiconductor element.

4. The semiconductor device according to claim 3, wherein
   said first, second, fourth and third semiconductor layers are adjacent to each other in this order, and
   said first and third semiconductor layers function as a contact with respect to said pn junction.

* * * * *